(12) United States Patent
Linn

(10) Patent No.: US 9,130,805 B2
(45) Date of Patent: Sep. 8, 2015

(54) PHASE DETECTOR

(76) Inventor: Yair Linn, Vancouver (CA)

( * ) Notice: Subject to any disclaimer, the term of this patent is extended or adjusted under 35 U.S.C. 154(b) by 0 days.

(21) Appl. No.: 13/882,804

(22) PCT Filed: Nov. 1, 2011

(86) PCT No.: PCT/CA2011/001217
§ 371 (c)(1),
(2), (4) Date: May 1, 2013

(87) PCT Pub. No.: WO2012/058757
PCT Pub. Date: May 10, 2012

(65) Prior Publication Data

US 2013/0223566 A1    Aug. 29, 2013
US 2015/0180691 A2    Jun. 25, 2015

Related U.S. Application Data

(60) Provisional application No. 61/409,544, filed on Nov. 3, 2010.

(51) Int. Cl.
*H03D 3/00* (2006.01)
*H04L 27/20* (2006.01)
(Continued)

(52) U.S. Cl.
CPC ............... *H04L 27/20* (2013.01); *H03D 13/00* (2013.01); *H03J 7/065* (2013.01); *H04B 17/009* (2013.01); *H04B 17/391* (2015.01); *H04L 27/3818* (2013.01)

(58) Field of Classification Search
CPC ......... H03D 3/007; H03M 5/12; H04L 27/22; H04L 27/0008; H04L 27/2332; H04L 27/2273; H04L 27/1563; H04L 27/2331; H04L 1/206; H04L 2027/003; H04L 2027/0067; H04L 2027/0057; H04L 2027/0028; H04L 7/0334; H04L 25/4904
USPC .................................................. 375/322–333
See application file for complete search history.

(56) References Cited

U.S. PATENT DOCUMENTS 3,878,475 A * 4/1975 Okano et al. .................... 331/12
4,121,166 A   10/1978 Matsumoto et al.
(Continued)

FOREIGN PATENT DOCUMENTS

WO    01/56239 A2    8/2001

OTHER PUBLICATIONS

"Digital Communication Receivers: Synchronization, Channel Estimation, and Signal Processing" H. Meyr, M. Moeneclaey, and S. Fechtel, NY: Wiley, 1998; pp. 271-323.
(Continued)

*Primary Examiner* — Dac Ha
*Assistant Examiner* — Janice Tieu
(74) *Attorney, Agent, or Firm* — McCormick, Paulding & Huber LLP

(57) ABSTRACT

Described are a method for generating a metric that is a function of a phase difference between a modulated carrier and a local carrier, and a phase detector for performing such a method. A baseband symbol is obtained from the modulated carrier, and the phase of the symbol is determined. Assuming that the modulation used to modulate the modulated carrier has a constellation diagram with M-fold rotational symmetry, the metric can be generated from the phase by evaluating a base function that includes a triangle wave having positively and negatively sloped linear segments whose slopes have identical absolute values and that is periodic with a period of $2\pi/M$ radians. Alternatively or additionally, if the ideal symbol phases are uniformly distributed, the metric can be generated by evaluating a version of the base function in which the ideal symbol phases correspond to identically valued metrics located on the triangle wave.

67 Claims, 11 Drawing Sheets

(51) Int. Cl.
*H04L 27/38* (2006.01)
*H03J 7/06* (2006.01)
*H03D 13/00* (2006.01)
*H04B 17/00* (2015.01)
*H04B 17/391* (2015.01)

(56) References Cited

U.S. PATENT DOCUMENTS

| | | | |
|---|---|---|---|
| 4,439,737 | A | 3/1984 | Mattei |
| 4,540,948 | A | 9/1985 | Ryu |
| 5,241,567 | A | 8/1993 | Shimakata |
| 6,633,616 | B2 | 10/2003 | Crawford |
| 7,529,314 | B2 | 5/2009 | Menkhoff |
| 7,577,217 | B2 | 8/2009 | Menkhoff et al. |
| 2002/0067778 | A1* | 6/2002 | Ahn ............................ 375/326 |
| 2002/0136329 | A1 | 9/2002 | Liu et al. |
| 2003/0112899 | A1* | 6/2003 | Linsky et al. ................ 375/327 |
| 2010/0061487 | A1* | 3/2010 | Kumar et al. ................ 375/322 |

OTHER PUBLICATIONS

"Synchronization in Digital Communications", vol. 1; H. Meyr and G. Ascheid, NY: Plenum Press, 1997; pp. 99-161.

"Synchronization Techniques for Digital Receivers" U. Mengali et al.: NY Plenum Press, 1997; pp. 189-306.

"Digital Communication Second Edition", E. A. Lee, et al., 2nd ed. Boston: Kluwer Academic Publishers, 1994; pp. 725-734.

"Altera Inc. Application Note 110: Gate Counting Methodology for APEX 20K Devices, Sep. 1999," at www.altera.com, accessed Sep. 2011; pp. 1-8.

"Xilinx Inc. Application XAPP 059P: Gate Count Capacity Metrics for FPGAs. Feb. 1997" at www.xilinx.com, accessed Sep. 2011; pp. 1-6.

"Efficient Hardware Realization of Truncated Multipliers using FPGA" M. H. Rais, International Journal of Engineering and Applied Sciences, vol. 4, No. 2, 2009; pp. 124-128.

"Phase Jitter in MPSK Carrier Tracking Loops: Analytical, Simulation, and Laboratory Results", Brian T. Kopp, et al.; IEEE Transactions on Communications, vol. 45, No. 11, Nov. 1997; pp. 1385-1388.

"Letter: Information Theory, Extended analysis of Viterbi-Viterbi synchronizers", W. Gappmair; European Transactions on Telecommunications, 2004; vol. 16, No. 2; pp. 151-155.

"Transmission Systems: Exact analysis of different detector algorithms for NDA carrier phase recovery of 16/32-APSK signals", W. Gappmair, et al.; European Transactions on Telecommunications, 2009, vol. 21, No. 2, pp. 154-166.

"Exact Analysis of Different Detector Algorithms for NDA Carrier Phase Recovery of 16-APSK Signals", W. Gappmair, et al. in Proc. Satellite and Space Communications, 2007. IWSSC '07. International Workshop on, Sep. 13-14, 2007, pp. 51-55.

"Generalized analysis of monomial-based Viterbi and Viterbi algorithms for NDA carrier phase estimation", W. Gappmair, Electronics Letters, Apr. 27, 2006, vol. 42, No. 9 Compendex, pp. 542-544.

"Detector characteristics for decision-directed carrier phase recovery of 16/32-APSK signals", W. Gappmair, et al.; Electronics Letters Dec. 7, 2006, vol. 42 No. 25, Compendex, pp. 1464-1466.

"Robust M-PSK Phase Detectors for Carrier Synchronization PLLs in Coherent Receivers: Theory and Simulations", Yair Linn; IEEE Trans. Commun., vol. 57, No. 6, Jun. 2009, pp. 1794-1805.

"A New Architecture for Coherent M-PSK Receivers", Yair Linn; in Proc. IEEE COMCAS'09, Tel-Aviv, Israel, Nov. 9-11, 2009; 14 pages.

"An Optimal Adaptive M-PSK Carrier Phase Detector Suitable for Fixed-Point Hardware Implementation within FPGAs and ASICs" Yair Linn, in Proc. IEEE 2006 Workshop on Signal Processing Systems (SiPS'06), Banff, AB, Canada, Oct. 2-4, 2006; pp. 238-243.

International Search Report for Serial No. PCT/CA2011/001217 dated Feb. 13, 2012.

* cited by examiner

```
module calculate_triangular_PD_metric
#(
parameter width = 8,
parameter num_modulations = 4
)
(
  input [width-1:0] theta,
  input clk,
  input [num_modulations-1:0] log2M_minus_1, //for BPSK this is 0, for QPSK this is 1, etc.
  output [width-1:0] PD_value,
  output logic [width-1:0] All_PD_values[num_modulations-1:0]
);
  logic [width-1:0] principal_theta[num_modulations-1:0];
  logic [width-1:0] intermediate_PD_values[num_modulations-1:0];
  logic [width-1:0] to_add_to_PD_theta[num_modulations-1:0];
  logic [width-2:0] temp_PD_value;

generate
            genvar current_modulation;
            for (current_modulation = 0; current_modulation < num_modulations; current_modulation++)
            begin : principal_theta_generate //format of principal theta is unsigned s1w1.f(width-2)
                assign    principal_theta[current_modulation]   =   {2'b00,theta[width-1-(current_modulation+3)
0],1'b0,{(current_modulation){1'b1}}};

always_comb
                begin
                    case (theta[width-1-(current_modulation+1) -: 2])
                        2'b00 : to_add_to_PD_theta[current_modulation] = 0;
                        2'b01 : to_add_to_PD_theta[current_modulation] = {2'b10,{(width-3){1'b1}},1'b1};
//-1
                        2'b10 : to_add_to_PD_theta[current_modulation] = 0;
                        2'b11 : to_add_to_PD_theta[current_modulation] = {2'b01,{(width-2){1'b0}}}; //-1
                    endcase
                end assign    intermediate_PD_values[current_modulation]    =   ~{{(width){~(theta[width-1-
(current_modulation+1)]^theta[width-1-(current_modulation+2)])}}    ^    principal_theta[current_modulation]}    +
to_add_to_PD_theta[current_modulation]};
            end
endgenerate safely_discard_upper_sign_bits
(
.inwidth(width),
.number_of_bits_to_discard(1),
.outwidth(width-1)
)
safely_discard_upper_sign_bits_PD
(
  .indata(intermediate_PD_values[log2M_minus_1]),
  .outdata(temp_PD_value)
);
assign PD_value = {temp_PD_value,1'b1};

assign All_PD_values = intermediate_PD_values;

endmodule
```

```
module safely_discard_upper_sign_bits
#(
  parameter inwidth = 16,
  parameter number_of_bits_to_discard = 1,
  parameter outwidth = 8
)
(
  input [inwidth-1:0] indata,
  output [outwidth-1:0] outdata
);

wire [outwidth-1:0] outdata_raw = {indata[inwidth-1], indata[inwidth-2-number_of_bits_to_discard -: {outwidth-
1}]};
    wire [number_of_bits_to_discard-1:0] discarded_bits = indata[inwidth-2 -: number_of_bits_to_discard];
    wire sign_bit = indata[inwidth-1];
    wire overflow_situation_occurred = (|{discarded_bits ^{number_of_bits_to_discard{sign_bit}}}) | (outdata_raw ==
{1'b1,{(outwidth-1){1'b0}}});
    wire [outwidth-1:0] overflow_output_value = {sign_bit,{(outwidth-2){~sign_bit}},1'b1}; //avoid unsymmetric 2's
complemente range assign outdata = overflow_situation_occurred ? overflow_output_value : outdata_raw;

endmodule
```

Fig. 6

PHASE DETECTOR

CROSS REFERENCE TO RELATED APPLICATIONS

This application is entitled to the benefit of and incorporates by reference essential subject matter disclosed in International Patent Application No. PCT/CA2011/001217 filed on Nov. 1, 2011 and U.S. Patent Application No. 61/409,544 filed Nov. 3, 2010.

TECHNICAL FIELD

The present disclosure is directed at a phase detector that generates a metric that is a function of a phase difference between a modulated carrier and a local carrier.

BACKGROUND

Wireless digital communications often involves transmission of symbols using a modulated carrier and the subsequent coherent demodulation of the modulated carrier by a receiver. One way to perform coherent demodulation is to synchronize the receiver's local carrier with the modulated carrier using a phase locked loop (PLL). PLLs attempt to eliminate the phase error between the modulated carrier and the local carrier. One component of a PLL is a phase detector.

In digital communications, and particularly in mobile digital communications, it is beneficial to employ circuitry that is fast, inexpensive, relatively simple, and power efficient. Accordingly, research and development continue into improving the designs of PLLs.

SUMMARY

According to one aspect, there is provided a method for generating a metric that is a function of a phase difference between a modulated carrier and a local carrier. The method includes obtaining a baseband symbol from the modulated carrier that is modulated using the symbol according to a modulation whose constellation diagram has M-fold rotational symmetry, wherein M is a positive integer greater than or equal to 2; determining a received phase of the symbol; and generating the metric from the received phase, wherein possible metrics depend on possible received phases according to a base function that comprises a triangle wave having positively and negatively sloped linear segments whose slopes have identical absolute values and that is periodic with a period of $2\pi/M$ radians.

According to another aspect, there is provided a method for generating a metric that is a function of a phase difference between a modulated carrier and a local carrier. The method includes obtaining a baseband symbol from the modulated carrier that is modulated using the symbol according to a modulation order (M) equaling the number of distinct ideal symbol phases used to modulate the modulated carrier, wherein ideal symbol phases are uniformly distributed within any continuous phase interval spanning $2\pi$ radians; determining the phase of the symbol; and generating the metric from the phase, wherein possible metrics depend on possible phases according to a base function that comprises a triangle wave having positively and negatively sloped linear segments whose slopes have identical absolute values and that is periodic with a period of $2\pi/M$ radians, wherein the ideal symbol phases correspond to identically valued metrics located on the triangle wave.

The maxima and minima of the triangle wave may have identical absolute values.

The base function may have a value of zero at each of the ideal symbol phases.

The ideal symbol phases may correspond to identical values for the metric located along either the positively sloped linear segments or the negatively sloped linear segments.

The modulated carrier may be modulated according to QAM and, optionally, Rectangular QAM.

The number of modulation symbols may equal $2^k$, wherein k is a positive integer.

The modulated carrier may be modulated according to M-ary phase shift keying. Optionally, M may equal $2^k$, wherein k is a positive integer.

The modulation may be selected from the group consisting of BPSK, QPSK, 8-PSK, 16-PSK, Rectangular QAM-4, Rectangular QAM-16, Rectangular QAM-64, Rectangular QAM-256, Rectangular Offset-QAM-16, Rectangular Offset-QAM-64, Rectangular Offset-QAM-256, Offset-QPSK, Offset-8PSK, Offset-16PSK, and Minimum Shift Keying.

The received phase may be expressed as being between $[-\pi,\pi)$ radians prior to generating the metric, and the base function may be implemented such that it spans only $[-\pi,\pi)$ radians.

The received phase may be encoded using an encoding scheme that linearly encompasses substantially all of the possible received phases.

The metric may be generated as a function of a principal angle that is directly proportional to the received phase modulo $(\pi/2M)$.

The principal angle may be normalized such that its supremum equals the absolute value of the maxima of the triangle wave.

The principal angle may include one or more of the least significant bits of the received phase.

Generating the metric may involve inverting the principal angle as a function of one or more bits of the received phase; and adding one of A, −A or 0 to the principal angle or its inverse as a function of two or more bits of the received phase, wherein A is the absolute value of the maxima of the triangle wave.

The encoding scheme may be one's complement, two's complement, or sign-magnitude encoding, the received phase may have b bits, and M may equal $2^k$, wherein k is a positive integer.

The principal angle may include a plurality of the most significant bits of bits [b-3-$\log_2$ M:0] of the received phase.

The principal angle may be proportional to a binary number that includes a plurality of the most significant bits of bits [b-3-$\log_2$ M:0] of the received phase.

Generating the metric may include inverting the principal angle as a function of one or more of the bits [b-1-$\log_2$ M:b-2-$\log_2$ M] of the received phase; and adding either A, −A or 0 to the principal angle or its inverse as a function of bits [b-1-$\log_2$ M:b-2-$\log_2$ M] of the received phase, wherein A is the absolute value of the maxima of the triangle wave.

According to another aspect, there is provided a phase detector for generating a metric that is a function of a phase difference between a modulated carrier and a local carrier. The phase detector includes a front end configured to obtain a baseband symbol from the modulated carrier that is modulated using the symbol according to a modulation whose constellation diagram has M-fold rotational symmetry, wherein M is a positive integer greater than or equal to 2; a phase determiner communicatively coupled to the front end and configured to determine a received phase of the baseband symbol; and a metric generator communicatively coupled to the phase determiner and configured to generate the metric from the received phase, wherein possible metrics depend on possible received phases according to a base function that comprises a triangle wave having positively and negatively sloped linear segments whose slopes have identical absolute values and that is periodic with a period of $2\pi/M$ radians.

According to another aspect, there is provided a phase detector for generating a metric that is a function of a phase difference between a modulated carrier and a local carrier. The phase detector includes a front end configured to obtain a baseband symbol from the modulated carrier that is modulated using the symbol according to a modulation order (M) equaling the number of distinct ideal symbol phases used to modulate the modulated carrier, wherein ideal symbol phases are uniformly distributed within any continuous phase interval spanning $2\pi$ radians; a phase determiner communicatively coupled to the front end and configured to determine the phase of the baseband symbols; and a metric generator communicatively coupled to the phase determiner and configured to determine the metric from the phase, wherein possible metrics depend on possible phases according to a base function that comprises a triangle wave having positively and negatively sloped linear segments whose slopes have identical absolute values and that is periodic with a period of $2\pi/M$ radians, wherein the ideal symbol phases correspond to identically valued metrics located on the triangle wave.

The maxima and minima of the triangle wave may have identical absolute values.

The base function may have a value of zero at each of the ideal symbol phases.

The ideal symbol phases may correspond to identical values for the metric located along either the positively sloped linear segments or the negatively sloped linear segments.

The modulated carrier may be modulated according to QAM and, optionally, Rectangular QAM.

The number of modulation symbols may equal $2^k$, wherein k is a positive integer.

The modulated carrier may be modulated according to M-ary phase shift keying and, optionally, M may equal $2^k$, wherein k is a positive integer.

The modulation may be selected from the group consisting of BPSK, QPSK, 8-PSK, 16-PSK, Rectangular QAM-4, Rectangular QAM-16, Rectangular QAM-64, Rectangular QAM-256, Rectangular Offset-QAM-16, Rectangular Offset-QAM-64, Rectangular Offset-QAM-256, Offset-QPSK, Offset-8PSK, Offset-16PSK, and Minimum Shift Keying.

The phase determiner may be configured to express the received phase as being between $[-\pi,\pi)$ radians, and the base function may be implemented such that it spans only $[-\pi,\pi)$ radians.

The phase determiner may be configured to encode the received phase using an encoding scheme that linearly encompasses substantially all of the possible received phases.

The metric generator may be configured to determine for the received phase a principal angle that is directly proportional to the received phase modulo ($\pi/2M$) and to determine the metric as a function of the principal angle.

The metric generator may be configured to normalize the principal angle such that its supremum equals the absolute value of the maxima of the triangle wave.

The phase determiner may encode the received phase such that the principal angle comprises one or more of the least significant bits of the phase.

The phase determiner may encode the received phase such that one or more bits (inversion control bits) of the received phase indicate whether to invert the principal angle and such that two or more bits (selection bits) of the received phase indicate whether to add A, −A or 0 to the principal angle or its inverse, wherein A is the absolute value of the maxima of the triangle wave, and the metric generator may include inverting hardware having (i) a data input to which the principal angle is input; (ii) an inversion control input to which the inversion control bits are input; and (iii) a data output that outputs the inverse of the principal angle when the inversion control bits indicate the principal angle is to be inverted and otherwise outputs the principal angle; data selection hardware having (i) data inputs to which A, −A or 0 is input; (ii) a data selection input to which the selection bits are input; and (iii) a data output that outputs either A, −A or 0 in accordance with which one of the data inputs of the data selection hardware is selected by the selection bits; and adding hardware having (i) data inputs communicatively coupled to the data outputs of the inverting hardware and the data selection hardware; and (ii) a data output that outputs the sum of signals at the data inputs of the adding hardware.

The inverting hardware may include a first XOR gate configured to receive the inversion control bits and an array of XOR gates each having one input to receive one bit of the principal angle, wherein the output of the first XOR gate is communicatively coupled to another input of each of the XOR gates in the array. The data selection hardware may include a multiplexer. The adding hardware may include an adder.

A may be 1.

The phase determiner may encode the received phase such that a principal angle precursor includes one or more of the least significant bits of the received phase, and the principal angle may be directly proportional to the principal angle precursor.

The phase determiner may encode the received phase such that one or more bits (inversion control bits) of the received phase indicate whether to invert the principal angle precursor and such that two or more bits (selection bits) of the received phase indicate whether to add A, −A or 0 to the principal angle or its inverse, wherein A is the absolute value of the maxima of the triangle wave, and the metric generator may include inverting hardware comprising (i) a data input to which the principal angle precursor is input; (ii) an inversion control input to which the inversion control bits are input; and (iii) a data output that outputs the inverse of the principal angle precursor when the inversion control bits indicate the principal angle precursor is to be inverted and otherwise outputs the principal angle precursor; data selection hardware having (i) a data input to which A, −A and 0 are input; (ii) a data selection input to which the selection bits are input; and (iii) a data output that outputs either A, −A or 0 in accordance with which one of the data inputs of the data selection hardware is selected by the selection bits; amplification hardware having (i) a data input communicatively coupled to the data output of the inverting hardware; and (ii) a data output that outputs the amplification of the signal at the data input; and adding hardware having (i) data inputs communicatively coupled to the data outputs of the amplification hardware and the data selection hardware; and (ii) a data output that outputs the sum of signals at the data inputs of the adding hardware.

The phase determiner may encode the received phase in one's complement, two's complement, or sign-magnitude encoding. The received phase may have b bits and M may equal $2^k$ wherein k is a positive integer, and the principal angle may include a plurality of the most significant bits of bits [b-3-$\log_2$ M:0] of the received phase.

The phase determiner may encode the received phase such that one or more of bits [b-1-$\log_2$ M:b-2-$\log_2$ M] (inversion control bits) of the received phase indicate whether to invert the principal angle and such that bits [b-log$_2$ M-1:b-log$_2$ M-2] (selection bits) of the received phase indicate whether to add A, −A or 0 to the principal angle or its inverse, wherein A is the absolute value of the maxima of the triangle wave, and the metric generator may include inverting hardware having (i) a data input to which the principal angle is input; (ii) an inversion control input to which the inversion control bits are input; (iii) a data output that outputs the inverse of the principal angle when the inversion control bits indicate the principal angle is to be inverted and otherwise outputs the principal angle; data selection hardware having (i) data inputs to which A, −A or 0 are input; (ii) a data selection input to which the selection bits are input; and (iii) a data output that outputs either A, −A or 0 in accordance with which one of the data inputs of the data selection hardware is selected by the selection bits; and adding hardware having (i) data inputs communicatively coupled to the data outputs of the inverting hardware and the data selection hardware; and (ii) a data output that outputs the sum of the data outputs of the inverting hardware and the data selection hardware.

The inverting hardware may be a first XOR gate configured to receive the inversion control bits and an array of XOR gates each having one input to receive one bit of the principal angle, wherein the output of the first XOR gate is communicatively coupled to another input of each of the XOR gates in the array. The data selection hardware may be a multiplexer. The adding hardware may be an adder.

A may be 1.

The phase determiner may encode the received phase in one's complement, two's complement, or sign-magnitude encoding, wherein the received phase may have b bits and M may equal $2^k$ wherein k is a positive integer. The principal angle may be proportional to a principal angle precursor that includes a plurality of the most significant bits of bits [b-3-log$_2$ M:0] of the received phase.

The phase determiner may encode the received phase such that one or more of the bits [b-1-log$_2$ M:b-2-log$_2$ M] (inversion control bits) of the received phase indicates whether to invert the principal angle precursor and such that bits [b-log$_2$ M-1:b-log$_2$ M-2] (selection bits) of the received phase indicate whether to add A, −A or 0 to the principal angle or its inverse, wherein A is the absolute value of the maxima of the triangle wave, and the metric generator may include inverting hardware having (i) a data input to which the principal angle precursor is input; (ii) an inversion control input to which the inversion control bits are input; and (iii) a data output that outputs the inverse of the principal angle precursor when the inversion control bits indicate the principal angle precursor is to be inverted and otherwise outputs the principal angle precursor; data selection hardware having (i) a data input to which A, −A and 0 are input; (ii) a data selection input to which the selection bits are input; and (iii) a data output that outputs either A, −A or 0 in accordance with which one of the data inputs of the data selection hardware is selected by the selection bits; amplification hardware having (i) a data input communicatively coupled to the data output of the inverting hardware; and (ii) a data output that outputs the amplification of the signal at the data input; and (d) adding hardware having (i) data inputs communicatively coupled to the data outputs of the amplification hardware and the data selection hardware; and (ii) a data output that outputs the sum of signals at the data inputs of the adding hardware.

The inverting hardware may include a first XOR gate configured to receive the inversion control bits and an array of XOR gates each having one input to receive one bit of the principal angle precursor, wherein the output of the first XOR gate is communicatively coupled to another input of each of the XOR gates in the array. The data selection hardware may include a multiplexer. The amplification hardware may include a bit shifter. The adding hardware may include an adder.

According to another aspect, there is provided a phase detector for generating a metric that is a function of a phase difference between a modulated carrier and a local carrier. The phase detector includes selecting means for selecting one of A, −A or 0 in response to selection bits; inverting means for inverting a principal angle in response to inversion control bits; and adding means, communicatively coupled to outputs of the selecting means and the inverting means, for adding one of A, −A or 0 to the principal angle or its inverse to generate the metric, wherein the modulated carrier is modulated using a symbol according to a modulation order (M) equaling the number of distinct ideal symbol phases used to modulate the modulated carrier, wherein ideal symbol phases are uniformly distributed within any continuous phase interval spanning 2π radians, and wherein the principal angle is modulo (π/2M) of the phase of the symbol, normalized to have a supremum of A.

According to another aspect, there is provided a phase detector for generating a metric that is a function of a phase difference between a modulated carrier and a local carrier. The phase detector includes selecting means for selecting one of A, −A or 0 in response to selection bits; inverting means for inverting a principal angle in response to inversion control bits; and adding means, communicatively coupled to outputs of the selecting means and the inverting means, for adding one of A, −A or 0 to the principal angle or its inverse to generate the metric, wherein the modulated carrier is modulated using a symbol according to a modulation whose constellation diagram has M-fold rotational symmetry, wherein M is a positive integer greater than or equal to 2, and wherein the principal angle is modulo (π/2M) of the phase of the symbol, normalized to have a supremum of A.

The modulation may be selected from the group consisting of BPSK, QPSK, 8-PSK, 16-PSK, Rectangular QAM-4, Rectangular QAM-16, Rectangular QAM-64, Rectangular QAM-256, Rectangular Offset-QAM-16, Rectangular Offset-QAM-64, Rectangular Offset-QAM-256, Offset-QPSK, Offset-8PSK, Offset-16PSK, and Minimum Shift Keying.

According to another aspect, there is provided an apparatus for evaluating a base function. The apparatus includes a front end configured to obtain a baseband symbol from a modulated carrier that is modulated using the symbol according to a modulation; a phase determiner communicatively coupled to the front end and configured to determine a received phase of the baseband symbol; and a metric generator communicatively coupled to the phase determiner and configured to generate the metric from the received phase, wherein possible metrics depend on possible received phases according to a base function that comprises a triangle wave having positively and negatively sloped linear segments whose slopes have identical absolute values and that is periodic with a period of 2π/N radians, wherein N is a positive integer greater than 1.

BRIEF DESCRIPTION OF THE DRAWINGS

In the accompanying drawings, which illustrate one or more exemplary embodiments:

FIG. 6 is exemplary SystemVerilog code that can be used to implement one or more embodiments of the metric generator.

DETAILED DESCRIPTION

Carrier phase error elimination in M-PSK receivers is usually achieved via one of two methods. The first technique uses a feedforward phase estimator to estimate the phase error, and that estimate is then used to demodulate the received and modulated signal. The second technique is the use of feedback, namely the removal the carrier phase error using a Phase Locked Loop (PLL) that attempts to cancel the phase error between the local and received carriers.

Carrier synchronization Phase Lock Loops (PLLs) obtain an estimate of the phase error via a carrier Phase Detector (PD). There are two general types of PDs: Non Data Aided (NDA) and Decision Directed (DD). One common problem with the DD and NDA detectors is that their gain is strongly dependent upon the input signal levels and the AGC (Automatic Gain Control) circuit's operating point and performance. If the PD's gain is variable with one or both of signal level and AGC performance, this means that the carrier PLL's characteristics will vary accordingly, which means that a non-optimal AGC causes a similar non-optimality of the performance of the carrier PLL.

The following embodiments are directed at NDA phase detector structures for carrier synchronization for M-PSK or other modulations. These detectors allow the carrier PLL to become nearly independent of the AGC and signal levels while enjoying relatively good performance. Unlike conventional phase detectors, some of the following embodiments can be implemented relatively compactly, allowing them to be practically deployed using devices such as an FPGA (Field Programmable Gate Array) or ASIC (Application Specific Integrated Circuit). Additionally, the following embodiments allow multiple modulations to be supported by the same receiver with relatively little added complexity in order to support multiple modulations. The phase detector includes a metric generator into which is input the recovered instantaneous phase of a symbol used to modulate the modulated carrier. The metric generator generates a metric that is a function of a phase difference between a modulated carrier and a local carrier.

System Model

Figure 1:
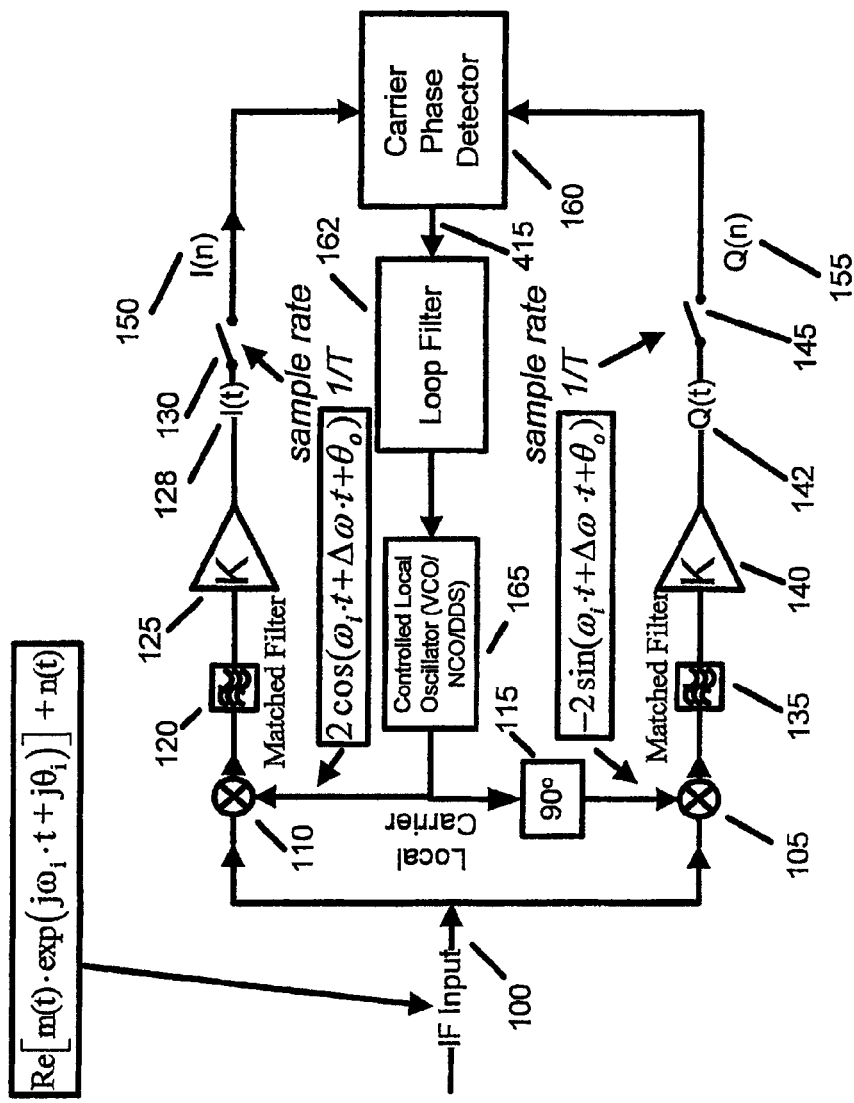
FIG. 1 is a simplified block diagram of an M-PSK receiver, according to one embodiment.
Figure 11:
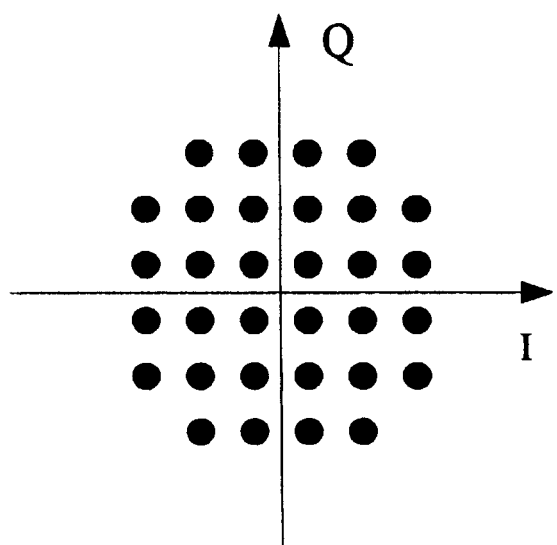
FIG. 11 is an exemplary constellation diagram for Rectangular QAM-32.

A simplified diagram of the front-end of a receiver under discussion is shown in FIG. 1. 1/T is the symbol rate and, as well in the exemplary embodiment, the sample rate. For the exemplary embodiment, a PSK (Phase Shift Keying) signal is assumed for simplicity. The transmitted baseband PSK signal is $m(t) \equiv \Sigma_{n=-\infty}^{\infty} a_n p(t-nT)$, with $p(t)$ being the pulse shape and the symbols being $a_n = \exp(j\phi_n)$, with $\phi_n = 2\pi \cdot m_n/M$ being the ideal symbol phases of the transmitted baseband symbols, with $m_n \in \{0, 1, \ldots, M-1\}$ (i.e., the phases are uniformly distributed in the interval $[0, 2\pi)$), where M is called the modulation order or modulation index (e.g. M=2 for BPSK (Binary Phase Shift Keying), M=4 for QPSK (Quaternary Phase Shift Keying), M=8 for 8-PSK, etc.). In alternative embodiments other phases are possible for different Ms which may be different from those used here in the exemplary embodiment. In general, for such constellations as M-PSK in which the distinct ideal symbol phases are uniformly distributed within any continuous angular interval spanning $2\pi$, M is the number of distinct ideal symbol phases of the symbols in the modulation's constellation diagram. By "uniformly distributed", it is meant that the phase difference between any two symbols of the modulation's constellation diagram is $2\pi k/M$, where k is an integer. In other embodiments such as for Rectangular QAM-32 (wherein QAM is Quadrature Amplitude Modulation) as shown in FIG. 11, the modulation order M for the purposes of defining the phase detector is the number of orders of rotational symmetry that the constellation diagram of the modulation has so long as the constellation diagram has at least two orders of rotational symmetry (i.e. has twofold rotational symmetry). For example, for Rectangular QAM-32 as shown in FIG. 11, the constellation diagram has fourfold rotational symmetry, and accordingly M=4. In general, a modulation's constellation has M-fold rotational symmetry if the smallest nonzero positive angle in radians by which the constellation may be rotated in the I-Q plane and which results in the same constellation form in the I-Q plane is $2\pi/M$. For example, as seen in FIG. 11, the angle $\pi/2$ is the smallest positive nonzero angle in radians for which a rotation of the QAM-32 constellation in FIG. 11 results in the same constellation form. Hence, for the constellation in FIG. 11, M=4.

The modulated signal 100 that is present at the output of the receiver's intermediate frequency (IF) downconversion stage is $\text{Re}[m(t)\exp(j\omega_i t + j\theta_i)] + n(t)$, where $n(t)$ is the noise process, with $\omega_i$ being the received IF carrier frequency in radians/sec, and $\theta_i$ (in radians) being the phase of the received IF carrier. In alternative embodiments the receiver may not have an intermediate frequency, or may have several intermediate frequencies, in which case appropriate modifications need to be made to the exemplary embodiments. Hence, the description of the exemplary embodiments should not be construed as limiting.

Alternative embodiments can be conceived in order to handle modulations that are related to M-PSK, such as O-MPSK (Offset MPSK), D-O-MPSK (Differential Offset MPSK), MSK (Minimum Shift Keying), GMSK (Gaussian Minimum Shift Keying), $\pi$/M-MPSK, D-$\pi$/M-MPSK (Differential $\pi$/M-MPSK), FQPSK (Feher's QPSK), $3\pi$/M-8PSK, D-$3\pi$/M-8PSK (Differential $3\pi$/M-8PSK), QAM (Quadrature Amplitude Modulation), OQAM (Offset QAM), PAM-PSK (Pulse Amplitude Modulation Phase Shift Keying), Offset-PAM-PSK, CPM (Continuous Phase Modulation) and its variants, and Trellis Coded Modulation (TCM) and its variants.

In the following, for the purpose of describing the exemplary embodiment, unless otherwise stated the description of the exemplary embodiment assumes an M-PSK signal wherein M is a positive integer power of 2, i.e. M equals $2^k$, wherein k is a positive integer. However alternative embodiments are possible for other modulation types, as mentioned above.

The matched filters' 120, 135 response is p*(−t) (where "*" denotes complex conjugation), $\theta_o$ (radians) is the phase of the receiver local carrier 165, and $\omega_o = \omega_i + \Delta\omega$ (radians/sec) is the local carrier frequency ($\Delta\omega$ is the frequency error between the received and local carriers in radians/sec). A quadrature receiver front end is assumed for the demodulator of the exemplary embodiment, i.e. multiplication by multipliers 105, 110 by the local carrier and its quadrature which is generated by passing the local carrier through a 90 degree phase shifter 115. Alternative embodiments may use other types of receiver front ends and, accordingly the exemplary embodiment presented here should not be construed as limiting. The local oscillator 165 in the exemplary embodiment is controlled by the output of the loop filter 162 which has as its input the output of the carrier phase detector 160. However, in alternative embodiments the oscillator may be controlled or may be free running, depending on the receiver architecture, and, moreover, the receiver structure may be implemented in analog, digital, or mixed logic, etcetera. Moreover, the phase detector may be used in embodiments employing feedback or feed-forward architectures or combinations thereof. For the purposes of describing this embodiment, symbol timing synchronization is assumed, and the Nyquist criterion for zero ISI is assumed obeyed at the outputs of the matched filters 120, 135. Optionally, amplifiers 125, 140 are included after the matched filters 120, 135. The quantity K for the amplifiers 125, 140 may be a true amplification or it may be a mathematical equivalent (preferably AGC-controlled) I-Q arm gain. In many receivers, K is a slow function of time, and is controlled by the AGC in order to attain the desired signal level at the inputs of the I and Q samplers so that they are not saturated yet their full dynamic range is utilized. The I(t) and Q(t) signals are sampled by samplers 130, 145, which operate at a rate of preferably at least 1/T Hertz, from which the relevant samples spaced 1/T seconds apart (corresponding to optimal sampling instances for each symbol) are extracted for the structures of this embodiment. In an alternative embodiments the sampling rate could be higher than 1/T Hertz. In such cases, the samples that correspond to the baseband symbols are extracted, preferably either via sample selection, or via interpolation, or both; the samples that are used ideally, but do not necessarily, correspond to the ideal sampling instances for the received symbols. These ideal sampling instances are usually determined via a symbol sampling synchronization or determination circuit that is contained within the receiver. In yet other embodiments, the sampling rate may be less than 1/T. In such cases, the structures presented herein would operate upon a subset of the received symbols, which is also possible.

The notations $n_I(t)$ and $n_Q(t)$ refer to the noise present before the (actual or equivalent) amplifiers 125, 140 in the I and Q arms, respectively. In many systems, this noise signal's source is an Additive White Gaussian Noise (AWGN) that is present in the channel, an assumption that is made for the purposes of describing this embodiment.

Following sampling, $I(n) = K(2E_S \cdot \cos(-\Delta\omega \cdot nT + \theta_e + \phi_n) + n_I(nT))$ 150 and $Q(n) = K(2E_S \cdot \sin(-\Delta\omega \cdot nT + \theta_e + \phi_n) + n_Q(nT))$ 155 are generated, with $\theta_e \equiv \theta_i - \theta_o$ and $n_I(nT), n_Q(nT) \sim N(0, 2N_0 E_S)$, where $$E_S \equiv \frac{1}{2} \int_{-\infty}^{\infty} |p(t)|^2 dt$$

is the symbol energy and $N_0/2$ is the AWGN power spectral density. The phase of the received (complex) baseband symbol $r_n \equiv I(n) + j \cdot Q(n)$ is $\phi_n \equiv \tan^{-1}(Q(n)/I(n))$, which as discussed in more detail below is the instantaneous phase of the received baseband symbol 405 ("received phase"). In polar coordinates, $r_n = |r_n| \exp(j\phi_n)$.

Without loss of generality, for mathematical convenience it can be assumed that $\forall n, \phi_n = 0$, whereupon:

$$\varphi_n \equiv \tan^{-1}\left(\frac{Q(n)}{I(n)}\right) = \tan^{-1}\left(\frac{\sin(-\Delta\omega \cdot nT + \theta_e) + n_Q(nT)/(2E_S)}{\cos(-\Delta\omega \cdot nT + \theta_e) + n_I(nT)/(2E_S)}\right) \quad (1)$$

The received phase $\phi_n$ 405 is independent of the value of K of the amplifiers 125, 140, as can be seen by the fact that K does not appear in (1). Since the exemplary embodiments rely on operations upon $\phi_n$ 405, this means that the embodiments herein do not depend upon K nor upon the AGC's control of K. This is advantageous, since the AGC is usually non-ideal and the value of K usually does fluctuate. The only dependence on the AGC is indirect and weak, and will manifest itself if the AGC is so bad that I(t) 128 and Q(t) 142 are either overdriven or underdriven, which will cause one or more of the effects known by those skilled in the art as saturation, compression, and quantization noise to be significant. However, usually the AGC can easily be made to be sufficiently robust in order to prevent frequent occurrences of overdriving and underdriving, so that the independence of the exemplary embodiment from K is a real and substantial advantage in practice.

Let:

$$\Delta\phi_n \equiv \phi_n - (-\Delta\omega nT + \theta_e) \quad (2)$$

Since it has been assumed for mathematical convenience in a non-limiting manner that $\forall n, \phi_n = 0$, the physical meaning of $\Delta\phi_n$ is clear: it is the phase error in the received phase of any one of the received baseband symbols, $\phi_n$ 405, relative to the symbol's ideal phase $\phi_n$, that can be attributed to noise, $n_I(nT)$ and $n_Q(nT)$ (to see this, substitute $n_I(nT) = n_Q(nT) = 0$ in the expressions for I(n) and Q(n), and then $\phi_n = \tan^{-1}(Q(n)/I(n)) = -\Delta\omega nT + \theta_e \rightarrow \Delta\phi_n - (-\Delta\omega nT + \theta_e) = 0$). $\Delta\phi_n$ as defined in (2) is distributed as a Rician phase pdf (probability distribution function) given by:

$$p_C(\Delta\phi \mid \chi) \equiv p(\Delta\phi_n = \Delta\phi \mid E_S/N_0 = \chi) \quad (3)$$

$$= \frac{e^{-\chi}}{2\pi}\left[1 + \sqrt{2\chi}\cos(\Delta\phi)\exp(\chi \cdot \cos^2(\Delta\phi)) \cdot \int_{-\infty}^{\cos(\Delta\phi)\sqrt{2\chi}} e^{-y^2/2} dy\right]$$

where $-\pi \leq \Delta\phi \leq \pi$.

Implementation of the Phase Determiner 400

A phase determiner 400 in the form an inverse tangent function is used to generate $\phi_n$ 405. Although in the depicted embodiments the inverse tangent function is used to implement the phase determiner 400, in alternative embodiments (not depicted) the phase determiner 400 may be implemented in a different manner, and not necessarily using the inverse tangent function. The phase determiner 400 can be the same one used for determining the signal phase for subsequently making decisions upon the received symbols (a common task in demodulators). Moreover, $\phi_n$ 405 can be used elsewhere in the receiver regardless of the value of M. Therefore, if structures are implemented for various Ms in the same receiver, such as in a receiver that has support for several modulations, the receiver may use one instance of the phase determiner

400. This reduces the resources needed and is another advantage of the exemplary embodiment. The inverse tangent in the exemplary embodiment is one whose range is $[-\pi,\pi)$, that is, it takes into account the quadrant in which $r_n$ is present. For example, it behaves similarly to the function atan 2 in the program Matlab™.

Phase Detector

Figure 2:
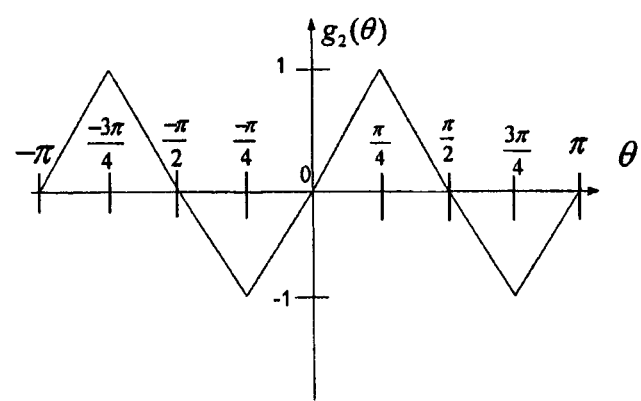
FIG. 2 is a graph of one embodiment of $g_2(\theta)$, a base function for BPSK.
Figure 3:
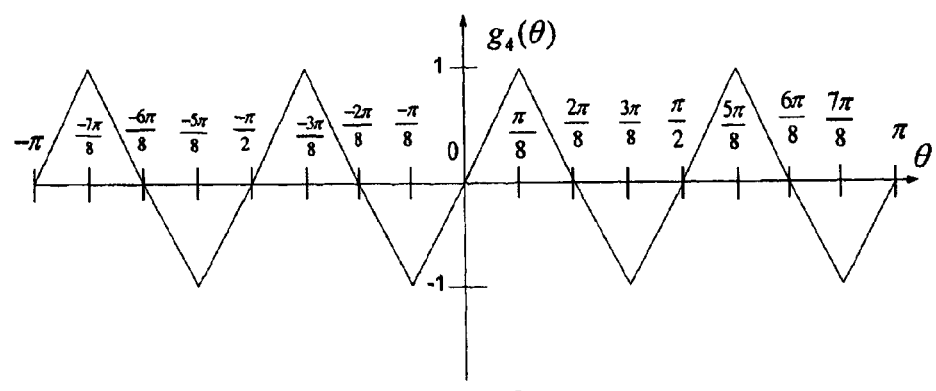
FIG. 3 is a graph of one embodiment of $g_4(\theta)$, the base function for QPSK.

FIGS. 2 and 3 show embodiments for BPSK and QPSK, respectively, of a base function used to generate the metric that is a function of the phase difference between the modulated and local carriers. In the embodiments depicted in FIGS. 2 and 3, the base function is denoted $g_M(\theta)$, where $\theta$ is an input variable representing an angle in radians and where M is the modulation order, and has a curve that is a triangle wave with periodicity of $2\pi/M$ radians. When used to generate the metric, $\phi_n$ 405 in radians is input to the base function, and $g_M(\phi_n)$ is evaluated. The triangle wave includes positively and negatively sloped linear segments that connect to each other at the triangle wave's maxima and minima. The absolute values of the slopes of the positively and negatively sloped segments have identical absolute values. The zero-crossings of the positively sloped linear segments in the depicted embodiments, which correspond to the stable PLL equilibrium points in the exemplary embodiment, result when $\phi_n$ 405 is one of the ideal symbol phases and when the modulation used utilizes uniformly distributed symbol phases within any continuous angular interval spanning $2\pi$ radians, as is the case with BPSK and QPSK; that is, in the depicted embodiments, when there is zero phase error, the output of the base function is zero. For example, for BPSK (M=2), see FIG. 2. For QPSK (M=4), see FIG. 3. $g_M(\theta)$ is defined through the periodic extension of its input value over the entire range of $\theta\in(-\infty,\infty)$ (that is, taking into account that every phase can be expressed as itself plus any integer multiple of $2\pi$), but the range of interest and implementation of $g_M(\theta)$ for the current embodiment is chosen to be $\theta\in[-\pi,\pi)$ radians since this covers the entire unique angle range of $2\pi$. An alternative embodiment is with the stable equilibrium point positioned at the zero crossings of the negative-sloped lines. Alternative embodiments of $g_M(\theta)$ may be such that their stable equilibrium points are any set of M points that are uniformly spaced in the interval $\theta\in[-\pi,\pi)$ with a spacing of $2\pi/M$; in particular, in the case where those phases do not correspond to the ideal symbol phases, the symbol decision logic in the receiver should be such that it takes this into account, as known to those skilled in the art. It is also noted that any angle can of course be expressed as itself plus any integer multiple of $2\pi$. Thus, in alternative embodiments, the angles can be defined as residing in any interval of at least length $2\pi$ (which usually would be a continuous interval (for simplicity) but not necessarily so), in which case this entails a corresponding adaptation of the definition of $g_M(\theta)$. In the present embodiment, $g_M(\theta)$ has a maximum of 1 and a minimum of −1. In other embodiments, $g_M(\theta)$ may have a maximum and minimum with different values, such as A for the maximum and −A for the minimum, where "A" is some non-zero value. In general, the maxima and minima of $g_M(\theta)$ will have identical absolute values (in the exemplary embodiment, for example, the value of this absolute value is "1"). In some embodiments $g_M(\theta)$ may have a DC offset, either inevitable (e.g. due to quantization) or intentional, that is for example the maximum will be A+DC and the minimum will be (−A+DC), where "DC" represents the DC offset. However, excessive DC offsets may cause performance degradations.

For some modulations, such as some instances of circular QAM and some instances of PAM-PSK (Pulse Amplitude Modulation Phase Shift Keying), the modulation may have two or more-fold rotational symmetry and the distinct ideal symbol phases of the modulation may be uniformly distributed. It may be possible to use multiple values of M when evaluating the base function $g_M(\theta)$ for such modulations. For example, the modulation may have M-fold rotational symmetry where M is a first value, and the modulation's constellation diagram may have M distinct ideal symbol phases, where M is a second value that differs from the first value. For example, this is true for certain constellations of circular QAM and PAM-PSK. For such modulations, it is within the purview of a skilled person to select which value of M is better to use when determining the appropriate base function $g_M(\theta)$.

A useful attribute of the triangular phase detector is that with clever implementation that takes advantage of the linear characteristic of the curves of $g_M(\cdot)$, the implementations of certain embodiments of $g_M(\theta)$ can be made to consume relatively few hardware resources. As already noted, the phase determiner 400 can be the same one used for decisions upon the received symbols, and therefore by using these phase detectors a relatively efficient implementation can be achieved, especially when multiple modulations are desired.

As a preliminary step, for the exemplary embodiment, the phase $\theta$ is encoded using a suitable encoding such as two's complement encoding which is b bits wide, in the exemplary embodiment from bits b−1 (the MSB (Most Significant Bit)) to 0 the LSB (Least Significant Bit). In the exemplary embodiment the MSB is the sign bit. The notation $\theta$ [x] is used in order to refer to significant bit number "x" in the binary representation of $\theta$. "x" is not necessarily the bit with index "x" counting from the right (as is the case in two's complement, starting with bit 0 as the LSB; in general, $\theta$[0] would refer to the LSB, $\theta$[1] would refer to the bit which is of the least significance except for the LSB, $\theta$[2] would refer to the bit that is of the least significance except for $\theta$[1] and $\theta$[0], etcetera. For example, for the exemplary embodiment, $\theta$[b−1] is the sign bit and MSB, and $\theta$[0] is the LSB. The notation $\theta$[x:y] is used to denote the binary number formed by the sequence of bits $\theta$[x], $\theta$[x−1], $\theta$[x−2], ..., $\theta$[y]. For example, $\theta$[3:0] signifies the binary number composed of the bits $\theta$[3], $\theta$[2], $\theta$[1], $\theta$[0] (e.g., if the code representing $\theta$ is 11110011 then $\theta$[3:0]=0011 in this case). Additionally, the codes are assigned to linearly encompass the entire angular range, i.e. $[-\pi,\pi)$ radians. That is, the lowest possible code (=the most negative code) represents the angle $-\pi$ radians, and the highest possible encoding (=the most positive code) represents $\pi-\epsilon$ radians, where $\epsilon=\pi/(2^{b-1})$. To give a few examples, if there are b=8 bits in the code, the code "10000000" represents the angle $-\pi$, the code "10000001" represents the number $-\pi+\pi/128$, "10000010" represents the angle $-\pi+2\pi/128$ and so on; the code "00000000" represents the angle 0, the code "00000001" represents the angle $\pi/128$, the code "00000010" represents the angle $2\pi/128$, and so on, and the highest code 01111111 represents the angle $127\pi/128=\pi-\pi/128=\pi-\pi/(2^{b-1})$. The purpose of this encoding is twofold. First, it maximizes the dynamic range utilization of the binary representation; since the angular range is $[-\pi,\pi)$ radians, the binary encoding encompasses this range and no codes are wasted. Hence quantization noise is minimized and the dynamic range of the binary representation is fully utilized. Secondly, as shall be seen below this is one way in which a relatively efficient implementation of $g_M(\cdot)$ can be obtained. Other encodings, such as one's-complement and sign-magnitude encoding can also similarly be used in other embodiments to attain similar efficiencies; the chosen encoding may, but does not need to, linearly encompass substantially all of the possible phases. It is also noted that the position of the LSB (which is the least significant) and MSB (which is the most significant) within the code word, as well as the position of the intermediate bits may depend on the encoding scheme used, which may vary from embodiment to embodiment. Additionally, for convenience the concatenation operation is defined as <x,y> which signifies the concatenation of the binary numbers x and y. For example, <0101,1111> is the binary number 01011111.

TABLE 1

Value of $g_2(\theta)$ as a function of $\theta_P$

| Angular Interval for input variable θ | Value of $g_2(\theta)$ as a function of $\theta_P$ | $\theta_P$ Multiplier | Addition to $\theta_P$ or $-\theta_P$ | θ[b − 1] | θ[b − 2] | θ[b − 3] |
|---|---|---|---|---|---|---|
| [−π, −3π/4) | $\theta_P$ | 1 | 0 | 1 | 0 | 0 |
| [−3π/4, −π/2) | $1 - \theta_P$ | −1 | 1 | 1 | 0 | 1 |
| [−π/2, −π/4) | $-\theta_P$ | −1 | 0 | 1 | 1 | 0 |
| [−π/4, 0) | $-1 + \theta_P$ | 1 | −1 | 1 | 1 | 1 |
| [0, π/4) | $\theta_P$ | 1 | 0 | 0 | 0 | 0 |
| [π/4, π/2) | $1 - \theta_P$ | −1 | 1 | 0 | 0 | 1 |
| [π/2, 3π/4) | $-\theta_P$ | −1 | 0 | 0 | 1 | 0 |
| [3π/4, π) | $-1 + \theta_P$ | 1 | −1 | 0 | 1 | 1 |

TABLE 2

Value of $g_4(\theta)$ as a function of $\theta_P$

| Angular Interval for input variable θ | Value of $g_4(\theta)$ as a function of $\theta_P$ | $\theta_P$ Multiplier | Addition to $\theta_P$ or $-\theta_P$ | θ[b − 1] | θ[b − 2] | θ[b − 3] | θ[b − 4] |
|---|---|---|---|---|---|---|---|
| [−π, −7π/8) | $\theta_P$ | 1 | 0 | 1 | 0 | 0 | 0 |
| [−7π/8, −3π/4) | $1 - \theta_P$ | −1 | 1 | 1 | 0 | 0 | 1 |
| [−3π/4, −5π/8) | $-\theta_P$ | −1 | 0 | 1 | 0 | 1 | 0 |
| [−5π/8, −π/2) | $-1 + \theta_P$ | 1 | −1 | 1 | 0 | 1 | 1 |
| [−π/2, −3π/8) | $\theta_P$ | 1 | 0 | 1 | 1 | 0 | 0 |
| [−3π/8, −π/4) | $1 - \theta_P$ | −1 | 1 | 1 | 1 | 0 | 1 |
| [−π/4, π/8) | $-\theta_P$ | −1 | 0 | 1 | 1 | 1 | 0 |
| [π/8, 0) | $-1 + \theta_P$ | 1 | −1 | 1 | 1 | 1 | 1 |
| [0, π/8) | $\theta_P$ | 1 | 0 | 0 | 0 | 0 | 0 |
| [π/8, π/4) | $1 - \theta_P$ | −1 | 1 | 0 | 0 | 0 | 1 |
| [π/4, 3π/8) | $-\theta_P$ | −1 | 0 | 0 | 0 | 1 | 0 |
| [3π/8, π/2) | $-1 + \theta_P$ | 1 | −1 | 0 | 0 | 1 | 1 |
| [π/2, 5π/8) | $\theta_P$ | 1 | 0 | 0 | 1 | 0 | 0 |
| [5π/8, 3π/4) | $1 - \theta_P$ | −1 | 1 | 0 | 1 | 0 | 1 |
| [3π/4, 7π/8) | $-\theta_P$ | −1 | 0 | 0 | 1 | 1 | 0 |
| [7π/8, π) | $-1 + \theta_P$ | 1 | −1 | 0 | 1 | 1 | 1 |

Figure 9:
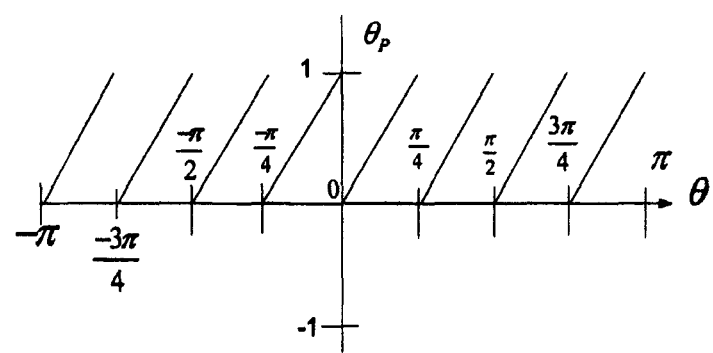
FIG. 9 is a graph of a principal angle, $\theta_P$, relative to an input phase, $\theta$.

To see how it is possible to efficiently implement $g_M(\cdot)$, note the linear characteristic of the base function $g_M(\cdot)$ at each interval of length $\pi/(2M)$, e.g. for BPSK the intervals are [−π,−3π/4), [−3π/4,−π/2), [−π/2,−π/4), [−π/4,0), [0,π/4), [π/4,π/2), [π/2,3π/4), [3π/4,π), as can be seen in FIG. 9. In each of these intervals the characteristic of $g_M(\cdot)$ is completely linear and has the same polarity. This can be exploited by cleverly encoding the angle, for example in two's complement notation, in order to implement the phase detection characteristic.

First, a principal angle is defined as:

$$\theta_P = \frac{\theta \bmod(\pi/(2M))}{\pi/(2M)} \quad (4)$$

Note that the "mod" (modulo) function is defined such that the value of $\theta_P$ is positive and is between 0 and 1, i.e. its range is [0,1). That is, the infimum of θp is 0 and the supremum of $\theta_P$ is 1. An example of $\theta_P$ for BPSK can be seen in FIG. 9.

Now, tables of the value of $g_2(\theta)$ as a function of $\theta_P$ and $g_4(\theta)$ as a function of $\theta_P$ are constructed, as shown below.

For a compact hardware implementation, note that, in two's complement notation of b bits, up to an inaccuracy of the LSB, in order to compute the phase detector (assuming the MSB is bit b−1 and the LSB is bit 0):

1. $\theta_P$ is the signed binary two's complement number <0,θ[b-3-log$_2$ M:0]> (concatenation of "0" and θ[b-3-log$_2$ M:0]), where it is understood that in the numerical encoding convention chosen by the designer the range of $\theta_P$ is [0,1) (or as close to that range as can be expressed by the resolution of the quantization of $\theta_P$).
2. $\theta_P$ is either inverted or not according to bits θ[b-log$_2$ M-1:b-log$_2$ M-2] of θ, for example as seen in Table 1 and Table 2.
3. Either 1, −1 or 0 (or as close to those values as can be expressed by the resolution of the quantization) is added to $\theta_P$ or its inverse according to bits θ[b-log$_2$ M-1:b-log$_2$ M-2], for example as seen in Table 1 and Table 2.

In this way, multiplications and any other complicated operations can be avoided, and there is no need for lookup tables. The base function can be implemented using elementary gates, multiplexers, and additions. Moreover, the overhead for generating a phase detector for a different modulation is quite minimal, since no new computation of θ is necessary.

Figure 5:
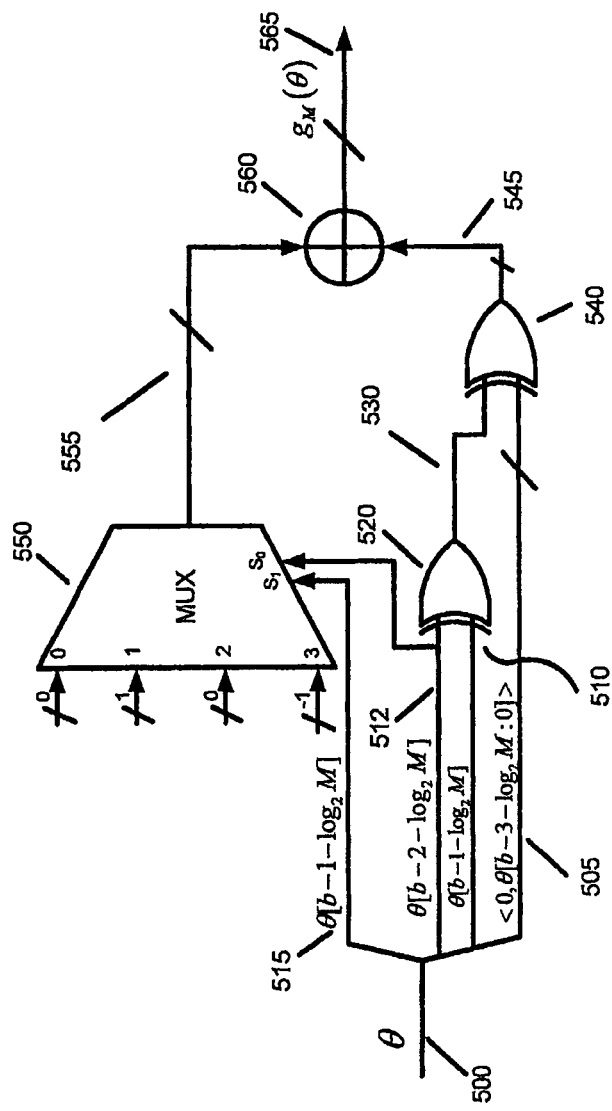
FIGS. 5 and 10 are schematics of exemplary circuitry that can be used to implement embodiments of a metric generator used to evaluate the base function, $g_M(\theta)$.

A schematic illustration of the efficient hardware implementation for computation of $g_M(\theta)$ for an exemplary embodiment is shown in FIG. 5. From the input variable θ

500, which is in the exemplary embodiment expressed as a two's complement binary fixed point notation, the bits whose indices θ[b-2-log$_2$ M] 512 and θ[b-1-log$_2$ M] 510 are passed through an exclusive OR (XOR) gate 520 and the resulting signal 530 is passed through an array of XOR gates 540 with bits <0,θ[b-3-log$_2$ M:0]> (concatenation of "0" and θ[b-3-log$_2$ M:0]) 505. This is done via XOR gates between each of the bits of <0,θ[b-3-log$_2$ M:0]> 505 and the signal 530. The array of XOR gates 540 is represented by a single XOR symbol (but which, it is made clear, reflects the aforementioned bitwise XOR). Collectively, the XOR gates 520, 540 act as inverting hardware that invert θ$_P$ depending on the value of bits θ[b-2-log$_2$ M] 512 and θ[b-1-log$_2$ M] 510. The bits having indices θ[b-log$_2$ M-1:b-log$_2$ M-2] 515, 512, are used to control the selection input of data selection hardware such as a multiplexer 550. The output 555 of the multiplexer 550 contains the constant 1, -1, or 0, which is added to θ$_P$ or -θ$_P$ in order to form g$_M$(θ), as shown for example for BPSK and QPSK in Table 1 and Table 2, respectively, and as discussed above. The value of θ$_P$ or -θ$_P$, as used to form g$_M$(θ) as shown for example for BPSK and QPSK in Table 1 and Table 2, respectively, is the signal 545 that is output from the array of XOR gates 540. The value of g$_M$(θ) 565 is generated by the summation by adding hardware such as an adder 560 of the output 555 of the multiplexer 550 and the output 545 of the array of XOR gates 540. This summation complies with all the rules for summation of signals, as appropriate for the chosen encoding (two's complement in the exemplary embodiment).

Figure 4:
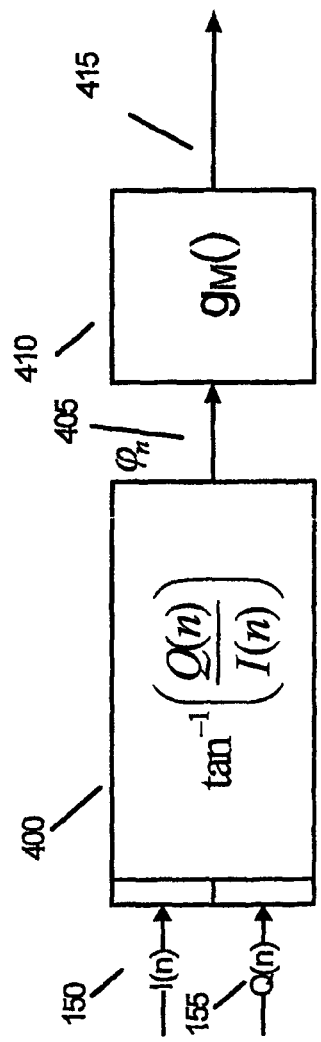
FIG. 4 is a block diagram of a phase determiner communicatively coupled to a metric generator, according to one embodiment.

This implementation of g$_M$(•), the metric generator 410, is the one that is used in order to generate the metric g$_M$(φ$_n$) 415, where φ$_n$ 405 is the input to that function block as used in the exemplary embodiment, as shown in FIG. 4. The angle φ$_n$ is encoded in the same manner as discussed for θ above.

For the exemplary embodiment, even though the input of g$_M$(θ) by convention signified the range [-π,π), the output by convention spans the range [-1,1). However, this is not necessarily the case in alternative embodiments. The range which the numerical encodings span is defined according to the designer's choice; for other embodiments, the output of g$_M$(θ) could span other ranges than [-1,1).

A SystemVerilog implementation of g$_M$(•) for various values of M, which requires no multiplications or other complicated operations, nor any significantly size lookup table, is shown in FIG. 6. The values of M supported by this implementation are M=2, M=4, M=8, and M=16. The input to the function is the input "theta", in two's complement notation. The phase detector outputs are in All_PD_values [num_modulations-1:0], also in two's complement notation (format is (width bits, from MSB to LSB): 1 sign bit, 1 whole bit, fraction bits). A selected output PD_value in two's complement is also provided (format is (width bits, from MSB to LSB): 1 sign bit, fraction bits), which is selected by the input log 2M_minus_1 (which is 0 for M=2, 1 for M=4, 2 for M=8, and 3 for M=16). FIG. 6 also shows how practical issues such as sign extension and binary point alignment are handled for operations such as inversion and addition of the various quantities.

Although in the exemplary embodiment a signed two's complement notation is used, other numerical representations can be used, including but not limited to one or more of floating point and other fixed point or variable point notations, and non-binary encodings.

Strictly speaking obtaining the negative of a number in two's complement notation, i.e. obtaining -x for a number x, is performed via (~x)+1, where "~" represents bitwise inversion. The procedure described above and in FIGS. 5 and 6 may be modified to take this into account in alternative embodiments. Due to the asymmetric nature of two's complement encoding (i.e. that there is one more of the negative values than of the positive values) in many systems (especially signal-processing structures) -x is calculated simply as (~x) in order to avoid potential overflow problems and in order to simplify logic. This is the procedure adopted for all the exemplary embodiments for two's complement representation.

Implementation of g$_M$(•) for Alternative Embodiments

In general, for alternative embodiments, a proportionality constant and modulo function ranges are chosen so that θ$_P$ is between 0 and A, i.e. the range of θ$_P$ is [0,A), where A is the absolute value of the maximum of the function g$_M$(•). That is, the infimum of θ$_P$ is 0 and the supremum of θ$_P$ is A. The normalization in such cases would be $$\theta_P \equiv A \cdot \frac{\theta \bmod (\pi/(2M))}{\pi/(2M)}.$$

For example, for BPSK:

TABLE 3

Value of g$_2$(θ) as a function of θ$_P$ for alternative embodiment where the maximum value of g$_2$(θ) is A

| Angular Interval for input variable θ | Value of g$_2$(θ) as a function of θ$_P$ | θ$_P$ Multiplier | Addition to θ$_P$ or -θ$_P$ | θ[b − 1] | θ[b − 2] | θ[b − 3] |
| --- | --- | --- | --- | --- | --- | --- |
| [-π, -3π/4) | θ$_P$ | 1 | 0 | 1 | 0 | 0 |
| [-3π/4, -π/2) | A - θ$_P$ | -1 | A | 1 | 0 | 1 |
| [-π/2, -π/4) | -θ$_P$ | -1 | 0 | 1 | 1 | 0 |
| [-π/4, 0) | -A + θ$_P$ | 1 | -A | 1 | 1 | 1 |
| [0, π/4) | θ$_P$ | 1 | 0 | 0 | 0 | 0 |
| [π/4, π/2) | A - θ$_P$ | -1 | A | 0 | 0 | 1 |
| [π/2, 3π/4) | -θ$_P$ | -1 | 0 | 0 | 1 | 0 |
| [3π/4, π) | -A + θ$_P$ | 1 | -A | 0 | 1 | 1 |

Similar tables can be constructed for other values of M and other modulations. These tables allow us to reach a relatively efficient implementation for the metric generator, as follows.

For a compact implementation for the exemplary embodiment, note that, in two's complement notation of b bits, up to an inaccuracy of the LSB (Least Significant Bit), in order to compute the base function (again, assuming the MSB (Most Significant Bit) is the bit of index b−1 and the LSB is the bit of index 0):

1. θ$_P$ is B multiplied by a signed binary two's complement number <0,θ[b-3-log$_2$ M:0]> (concatenation of "0" and θ[b-3-log$_2$ M:0]), where B is a proportionality constant such that the range of θ$_P$ is [0,A) according to the numerical encoding convention chosen by the designer (or as close to that range as can be expressed by the resolution of the quantization of θ$_P$)).
2. θ$_P$ is either inverted or not, according to bits θ[b-log$_2$ M-1:b-log$_2$ M-2] of θ, for example as seen in Table 3.
3. Either A, −A or 0 (or as close to those values as can be expressed by the resolution of the quantization) is added to θ$_P$ or its inverse according to bits θ[b-log$_2$ M-1:b-log$_2$ M-2], for example as seen in Table 3.

Also, for convenience, the "principal angle precursor" is defined as <0,θ[b-3-log$_2$ M:0]> for two's complement notation. In this case, it is clear from the above definitions that θ$_P$ is B multiplied by the principal angle precursor. In embodiments in which B equals one and the principal angle precursor is accordingly not amplified, the principal angle precursor and the principle angle are equal, as is the case for the embodiment described in relation to Tables 1 and 2, above. "Amplification" in the context of this disclosure does not necessarily mean that the amplitude increases; "amplification" by B in the context of this disclosure could also mean a reduction in amplitude (if B is less than 1) or no change in amplitude (if B equals 1).

Figure 10:
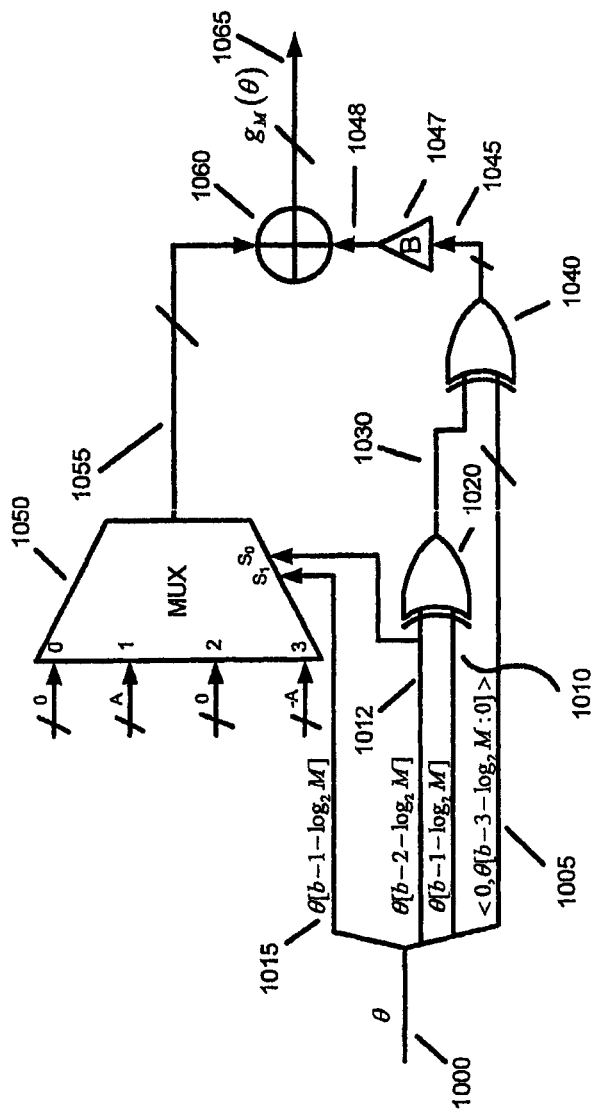

A schematic illustration of an efficient implementation for computation of $g_M(\theta)$ for such embodiments is shown in FIG. 10. From the input variable θ 1000, which in the exemplary embodiment is expressed in two's complement binary fixed point notation, the bits whose indices are θ[b-2-log₂ M] 1012 and θ[b-1-log₂ M] 1010 are passed through an exclusive OR (XOR) gate 1020 and the signal 1030 that results is passed through an array of exclusive OR gates 1040 with bits <0,θ[b-3-log₂ M:0]> (concatenation of "0" and θ[b-3-log₂ M:0]), 1005. This is done via XOR gates between each of the bits of <0,θ[b-3-log₂M:0]> 1005 and the signal 1030, which is represented by a single XOR symbol 1040 (but which, it is made clear, reflects the aforementioned bitwise XOR). The XOR gates 1020, 1040 represent the inverting hardware used to perform controlled inversion. The bits whose indices are θ[b-log₂ M-1:b-log₂ M-2] 1015, 1012, are used to control the selection input of a data selector such as a multiplexer 1050. The output 1055 of that multiplexer 1050 contains the constant A, −A, or 0 that is added to $\theta_P$ or $-\theta_P$ in order to generate the metric $g_M(\theta)$, as shown for example for BPSK in Table 3 and as discussed above. The value of $\theta_P$ or $-\theta_P$, as used to generate the metric $g_M(\theta)$ as shown for example for BPSK in Table 3, is the signal 1048 that is obtained by amplifying the result of the controlled inversion via an amplification device 1047 such as a multiplier or a bit shifter. The value of the metric $g_M(\theta)$ 1065 is generated by the summation via adding hardware such as an adder 1060 of the output 1055 of the multiplexer 1050 and the output 1048 of the amplification device 1047. This summation complies with all the rules for summation of signals, as appropriate for the chosen representation (e.g. two's complement in the exemplary embodiment). In the case that the signal at the output of the controlled inversion 1045 already has a supremum of A according to the numerical encoding convention chosen by the designer, then the amplification device 1047 may be omitted, that is, the output of the controlled inversion 1045 can be connected directly to the adding hardware 1060.

In alternative embodiments, where in the various exemplary embodiments the bits θ[b-3-log₂ M:0] are used, it is possible to use a plurality of the most significant bits of those bits, for example θ[b-3-log₂ M:0] (all the most significant bits of θ[b-3-log₂ M:0], as is done in the exemplary embodiments), or θ[b-3-log₂ M:1] (all the most significant bits of θ[b-3-log₂ M:0] except the LSB), or θ[b-3-log₂ M:2] (all the most significant bits of θ[b-3-log₂ M:0] except the two least significant bits), etc. In an embodiment that differs from the exemplary embodiment wherein not all the most significant bits of θ[b-3-log₂ M:0] are used, appropriate modifications are made to other parts of the receiver to accommodate the number of bits used. Such embodiments may be useful when a further reduction in resources is desired; however, such embodiments may be more susceptible to quantization noise.

Phase Detector Performance Analysis

The S-curve of the phase detector is computed via a Fourier series representation of $g_M(\phi_n)$:

$$S_{M,\chi}(\theta_e) = E[g_M(\varphi_n) | \theta_e] \tag{5}$$

$$= E\left[\frac{8}{\pi^2} \sum_{k=0}^{8} \frac{(-1)^k \sin(M \cdot (2k+1)\varphi_n)}{(2k+1)^2} \Bigg| \theta_e\right]$$

(note the implicit dependence upon χ through $\phi_n$). Now, using:

$$\varphi_n = \Delta\phi_n + \theta_e \tag{6}$$

And:

$$S_{M,\chi}(\theta_e) = E\left[\frac{8}{\pi^2} \sum_{k=0}^{8} \frac{(-1)^k \sin(M \cdot (2k+1)(\Delta\phi_n + \theta_e))}{(2k+1)^2} \Bigg| \theta_e\right] \tag{7}$$

$$= E\left[\frac{8}{\pi^2} \sum_{k=0}^{8} (-1)^k \left(\frac{\sin(M \cdot (2k+1)\Delta\phi_n)\cos(M \cdot (2k+1)\theta_e) +}{\cos(M \cdot (2k+1)\Delta\phi_n)\sin(M \cdot (2k+1)\theta_e)}\right) \Bigg| \theta_e\right]$$

$$= \frac{8}{\pi^2} \sum_{k=0}^{8} (-1)^k \left(\frac{E[\sin(M \cdot (2k+1)\Delta\phi_n)\cos(M \cdot (2k+1)\theta_e) | \theta_e] +}{E[\cos(M \cdot (2k+1)\Delta\phi_n)\sin(M \cdot (2k+1)\theta_e) | \theta_e]}\right)$$

$$= \frac{8}{\pi^2} \sum_{k=0}^{8} (-1)^k \left(\frac{E[\sin(M \cdot (2k+1)\Delta\phi_n)]\sin(M \cdot (2k+1)\theta_e)}{(2k+1)^2}\right)$$

Given that:

$$E[\cos(M \cdot (2k+1)\Delta\phi_n)] = \frac{\sqrt{\pi \cdot \chi}}{2} \cdot \exp\left(\frac{-\chi}{2}\right) \left[\begin{array}{c} I_{((2k+1)M-1)/2}\left(\frac{\chi}{2}\right) + \\ I_{((2k+1)M+1)/2}\left(\frac{\chi}{2}\right) \end{array}\right] \tag{8}$$

where $I_n(\cdot)$ is the n-th order modified Bessel function of the first kind, the following results:

$$S_{M,\chi}(\theta_e) = \tag{9}$$

$$\frac{8}{\pi^2} \sum_{k=0}^{\infty} (-1)^k \left(\left(\frac{\sqrt{\pi \cdot \chi}}{2} \cdot \exp\left(\frac{-\chi}{2}\right) \left[\begin{array}{c} I_{((2k+1)M-1)/2}\left(\frac{\chi}{2}\right) + \\ I_{((2k+1)M+1)/2}\left(\frac{\chi}{2}\right) \end{array}\right]\right) / (2k+1)^2\right)$$

$$\sin(M \cdot (2k+1)\theta_e)$$

As a useful approximation, using the fact that $$\frac{\sqrt{\pi \cdot \chi}}{2} \cdot \exp\left(\frac{-\chi}{2}\right) \left[\begin{array}{c} I_{((2k+1)M-1)/2}\left(\frac{\chi}{2}\right) + \\ I_{((2k+1)M+1)/2}\left(\frac{\chi}{2}\right) \end{array}\right] \xrightarrow{high\ SNR} \exp\left(\frac{-(2k+1)^2 M^2}{4\chi}\right) \tag{10}$$

Then approximately at high SNR:

$$S_{M,\infty}(\theta_e) = \lim_{\chi \to \infty} S_{M,\chi}(\theta_e) \quad (11)$$

$$= \frac{8}{\pi^2} \sum_{k=0}^{\infty} (-1)^k \left( \exp\left(\frac{-M^2(2k+1)}{4\chi}\right) \middle/ (2k+1)^2 \right) \sin$$

$$(M \cdot (2k+1)\theta_e)$$

Expression (11) is useful for calculations at high SNR, since in some numerical programs such as Matlab™ the calculation of Bessel functions is sometimes not sufficiently accurate at high SNRs. The gain of the phase detector is:

$$C_{M,\chi} \equiv \frac{\partial S_{M,\chi}(\theta_e)}{\partial \theta_e}\bigg|_{\theta_e=0}$$

$$= \left( \frac{8}{\pi^2} \sum_{k=0}^{\infty} (-1)^k \left( \left( \frac{\sqrt{\pi \cdot \chi}}{2} \cdot \exp\left(\frac{-\chi}{2}\right)\right) \begin{bmatrix} I_{((2k+1)M-1)/2}\left(\frac{\chi}{2}\right) + \\ I_{((2k+1)M+1)/2}\left(\frac{\chi}{2}\right) \end{bmatrix} \right) \middle/ (2k+1)^2 \right)$$

$$M \cdot (2k+1)$$

$$= \frac{8 \cdot M}{\pi^2} \sum_{k=0}^{\infty} (-1)^k \left( \frac{\sqrt{\pi \cdot \chi}}{2} \cdot \exp\left(\frac{-\chi}{2}\right) \begin{bmatrix} I_{((2k+1)M-1)/2}\left(\frac{\chi}{2}\right) + \\ I_{((2k+1)M+1)/2}\left(\frac{\chi}{2}\right) \end{bmatrix} \right) \middle/ (2k+1)$$

At high SNR:

$$C_{M,\infty} \equiv \lim_{\chi \to \infty} C_{M,\chi} = \frac{8 \cdot M}{\pi^2} \sum_{k=0}^{\infty} \frac{(-1)^k}{(2k+1)} \quad (13)$$

Using $\sum_{k=0}^{\infty} \frac{(-1)^k}{(2k+1)} = \frac{\pi}{4}$:

$$C_{M,\infty} = \frac{8 \cdot M}{\pi^2} \frac{\pi}{4} = \frac{2M}{\pi} \quad (14)$$

This can be verified graphically from the S-curve. The normalized gain of the phase detector is defined as:

$$\alpha_{M,\chi} \equiv \frac{C_{M,\chi}}{C_{M,\infty}} \quad (15)$$

$$= \frac{4}{\pi} \sum_{k=0}^{\infty} (-1)^k \left( \frac{\sqrt{\pi \cdot \chi}}{2} \cdot \exp\left(\frac{-\chi}{2}\right) \begin{bmatrix} I_{((2k+1)M-1)/2}\left(\frac{\chi}{2}\right) + \\ I_{((2k+1)M+1)/2}\left(\frac{\chi}{2}\right) \end{bmatrix} \right) \middle/ (2k+1)$$

Figure 8:
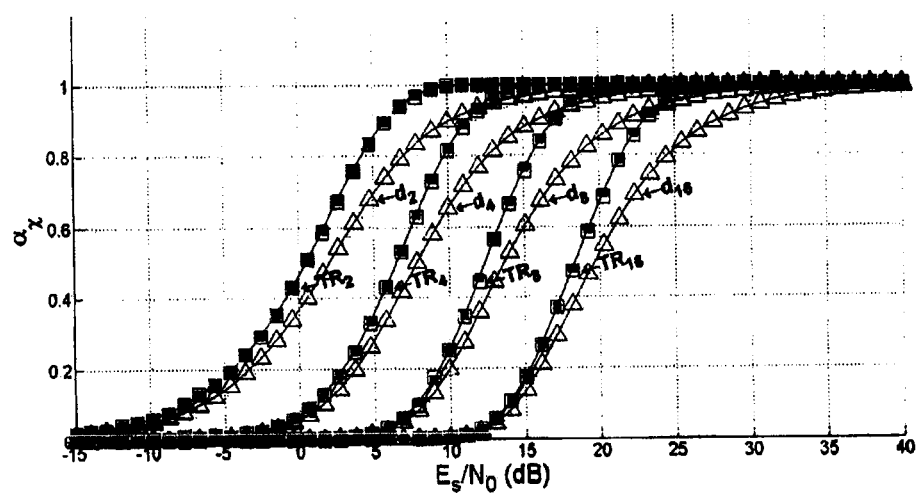
FIG. 8 is a graph illustrating normalized gains of embodiments of the phase detector compared to normalized gains of several prior art phase detectors.

A graph of $\alpha_{M,\chi}$ is shown in FIG. 8 (the squares, denoted as the curves labeled $TR_M$, where M=2,4,8,16 for M-PSK; the black squares are theory, while the transparent squares are simulation) and it is compared to the normalized gain of the prior art detector discussed in Y. Linn, "Robust M-PSK phase detectors for carrier synchronization PLLs in coherent receivers: theory and simulations," *IEEE Trans. Commun.*, vol. 57, no. 6, pp. 1794-1805, June 2009, which is represented by triangles (computed via theory) and denoted by $d_M$, where M=2,4,8,16 for M-PSK. As can be seen, the phase detector presented here has well-behaved normalized gains.

The normalized equivalent loop noise at $\phi_e \approx 0$ is defined as:

$$N_{M,\chi}(n) \equiv \lim_{\theta_e \to 0} (g_M(\varphi_n) - S_{M,\chi}(\theta_e))/C_{M,\infty} \quad (16)$$

which is:

$$N_{M,\chi}(n) \equiv \left( \frac{8}{\pi^2} \sum_{k=0}^{\infty} (-1)^k \frac{\sin(M \cdot (2k+1)\Delta\phi_n)}{(2k+1)^2} \right) \middle/ \frac{2M}{\pi} \quad (17)$$

(12)

-continued $$= \frac{4}{\pi M} \sum_{k=0}^{\infty} (-1)^k \frac{\sin(M \cdot (2k+1)\Delta\phi_n)}{(2k+1)^2}$$

The PD's self noise is defined as:

$$\xi_{M,\chi} \equiv 2 \cdot \chi \cdot \text{var}(N_{M,\chi}(n)) \quad (18)$$

Substituting results in:

$$\xi_{M,\chi} = 2\chi \cdot \text{var}(N_{M,\chi}(n)) \quad (19)$$

$$= 2\chi \int_{-\pi}^{\pi} \left( \frac{4}{\pi M} \sum_{k=0}^{\infty} (-1)^k \frac{\sin(M \cdot (2k+1)\tau)}{(2k+1)^2} \right)^2 p_R(\tau \mid \chi) \cdot d\tau$$

One of the most widely accepted performance metrics of a phase detector is the phase-error variance var($\theta_e$) (or equivalently, the loop-SNR $\rho \equiv 1/\text{var}(\theta_e)$) of a PLL that uses that phase detector. This is due to the fact that the phase-error variance has an important role in determining the cycle-slip rate of the carrier synchronization PLL and the SER (Symbol Error Rate). Determination of var($\theta_e$) via computer simulations is done using nonlinear models.

Figure 7:
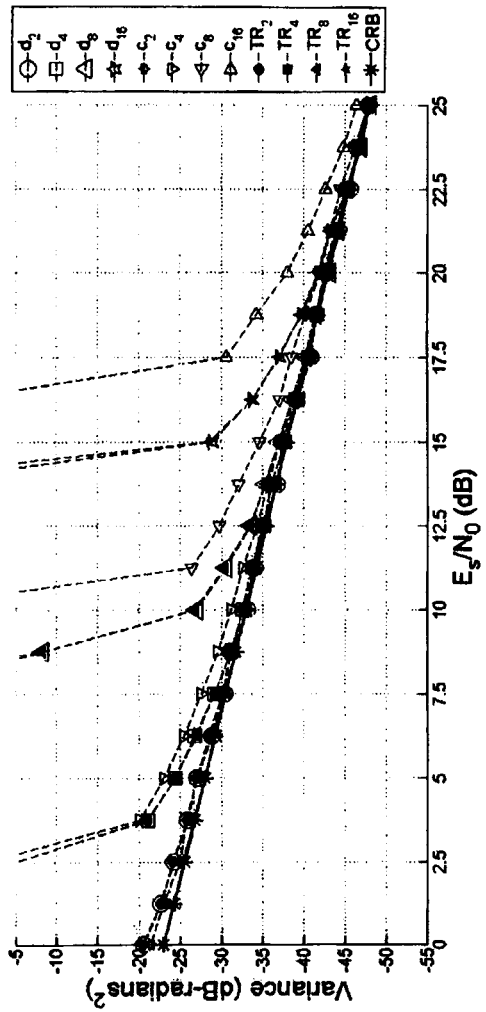
FIG. 7 is a graph illustrating performance of various embodiments of a phase detector compared to that of several prior art phase detectors.

To evaluate the performance of the foregoing embodiments of the phase detector, computer simulations are used in order determine var($\theta_e$) for various types of phase detectors. In FIG. 7, the phase error variance obtained using the proposed phase detectors ($TR_2$, $TR_4$, $TR_8$, $TR_{16}$ for M=2, M=4, M=8, and M=16, respectively, for M-PSK) is compared to the M-th order nonlinearity ($c_2$, $c_4$, $c_8$, $c_{16}$ for M=2, M=4, M=8, and M=16, respectively, for M-PSK) and the normalized M-th order nonlinearity detector ($d_2$, $d_4$, $d_8$, $d_{16}$ for M=2, M=4, M=8, and M=16, respectively, for M-PSK) discussed in Y. Linn, "Robust M-PSK phase detectors for carrier synchronization PLLs in coherent receivers: theory and simulations," *IEEE Trans. Commun.*, vol. 57, no. 6, pp. 1794-1805, June 2009. As can be seen, the proposed phase detectors have performance that is virtually identical to the normalized M-th order nonlinearity detector, which was shown to have best-in-class performance. Hence, the phase detectors described in this embodiment have excellent performance.

Reduction to Practice and Approximate Resource Usage Compared to Prior Art

All the structures presented in this document have been implemented in practice and proven to work by the inventor using a Terasic DE2-115 board with an Altera Cyclone IV FPGA.

The FPGA was also used to implement the phase detector disclosed in Y. Linn, "Robust M-PSK phase detectors for carrier synchronization PLLs in coherent receivers: theory and simulations," *IEEE Trans. Commun.*, vol. 57, no. 6, pp. 1794-1805, June 2009, as a point of comparison. In order to attain the comparison, several documents that calculate the equivalent gate count for FPGA structures were used as sources. These are documents *Altera Inc. Application Note 110: Gate Counting Methodology for APEX 20K Devices*, September 1999, *Xilinx Inc. Application XAPP 059: Gate Count Capacity Metrics for FPGAs*, February 1997 and M. H. Rais, "*Efficient Hardware Realization of Truncated Multipliers using FPGA*," International Journal of Engineering and Applied Sciences, vol. 4, no. 2, 2009. From those sources, the following approximate gate equivalences are obtained:

TABLE 4

| FPGA Structure | Approximate Average Equivalent Gates |
| --- | --- |
| Logic Cell (LC) (Combinational Content) | 10 |
| Register | 7.5 |
| Embedded Memory Bit | 4 |
| Multiplier (8 bit × 8 bit) | 500 |

Estimation of the number of gates from FPGA structures is an imprecise science, and those gate counts will differ from ASIC gate counts. Nonetheless, the values in Table 4 are useful for the purpose of making comparisons.

In the Altera Cyclone IV FPGA in the DE2-115 board used for tests, the following resource usage data was measured:

TABLE 5

| Implementation | Metric Memory Bits | LCs | Total Equivalent Gates |
| --- | --- | --- | --- |
| Prior Art for BPSK | 32768 | 1 | 131082 |
| Prior Art to Add QPSK | 32768 | 1 | 131082 |
| Prior Art to Add 8-PSK | 32768 | 1 | 131082 |
| Prior Art to Add 16-PSK | 32768 | 1 | 131082 |
| Total Prior Art for BPSK, QPSK, 8-PSK, and 16-PSK | 131072 | 4 | 524328 |
| Phase detector based on $g_2(\bullet)$ for BPSK | 32768 | 5 | 131122 |
| To add phase detector based on $g_4(\bullet)$ for QPSK | 0 | 5 | 50 |
| To add phase detector based on $g_8(\bullet)$ for 8-PSK | 0 | 5 | 50 |
| To add phase detector based on $g_{16}(\bullet)$ for 16-PSK | 0 | 5 | 50 |
| Total, Current Embodiment (structures based on $g_M(\theta)$) | 32768 | 20 | 131272 |

Comparing the results, the total number of required gates has decreased substantially, by about 74.96%, i.e. only about 25% of the logic resources are required as compared to prior art (131272 equivalent gates as opposed to 524328 for prior art). This also allows for a similar and corresponding reduction in power consumption and circuit area for the embodiment as compared to prior art.

As can be seen, the advantage of the present structures increases as the number of supported modulation increases, i.e. the advantage would be even greater if 5 or 6 modulations (e.g. also 32-PSK and 64-PSK) were implemented as well.

The above comparisons were done in a fair manner, that is, the chosen quantization for the present structures and those of the prior art were chosen so that both would have roughly the same performance.

As discussed above, in some of the foregoing embodiments of the phase detector, clever coding of the numerical representation of the symbol phases allows the phase detector to be implemented relatively compactly. Moreover, the foregoing embodiments allow for multiple modulations to be supported by the carrier PLL, requiring relatively few additional resources when adding support for additional modulations. This is advantageous over conventional phase detectors.

The performance of the embodiments described herein in terms of phase-error variance (the most widely used metric used by those skilled in the art) may be described in best-in-class. Moreover, the foregoing embodiments provide phase detection which is relatively independent from AGC performance and of signal levels. This is advantageous over many conventional phase detectors.

In addition to the hardware implementations discussed above, the foregoing embodiments may be encoded on to a computer readable medium that is readable by a processor so as to configure the receiver to have the functionality described above. The computer readable medium may be flash memory, RAM, any other suitable disc or semiconductor based memory, or any other suitable computer readable medium. Using software to implement the foregoing embodiments may be suitable when an embodiment of the base function is used that does not lend itself to a relatively efficient hardware implementation, or when the power consumption advantages of hardware are immaterial, for example.

For the sake of convenience, the example embodiments above are described as various interconnected functional blocks, which may be implemented using one or both of distinct hardware and software modules. This is not necessary, however, and there may be cases where these functional blocks or modules are equivalently aggregated into a single logic device, program or operation with unclear boundaries. In any event, the functional blocks, software, and hardware modules can be implemented by themselves, or in combination with other operations in one or both of hardware and software, or via any other suitable implementation method.

While particular example embodiments have been described in the foregoing, it is to be understood that other embodiments are possible and are intended to be included herein. It will be clear to any person skilled in the art that modifications of and adjustments to the foregoing example embodiments, not shown, are possible.

What is claimed is:

1. A method for generating a metric that is a function of a phase difference between a modulated carrier and a local carrier, the method comprising:
   obtaining a baseband symbol from the modulated carrier that is modulated using the symbol according to a modulation whose constellation diagram has M-fold rotational symmetry, wherein M is a positive integer greater than or equal to 2;
   determining a received phase of the symbol; and
   generating the metric from the received phase, wherein possible metrics depend on possible received phases according to a base function that comprises a triangle wave having positively and negatively sloped linear segments whose slopes have identical absolute values and that is periodic with a period of $2\pi/M$ radians.

2. The method as claimed in claim 1, wherein a maxima and minima of the triangle wave have identical absolute values.

3. The method as claimed in claim 1, wherein the modulated carrier is modulated according to Quadrature Amplitude Modulation.

4. The method as claimed in claim 3, wherein the number of modulation symbols equals $2^k$, wherein k is a positive integer.

5. The method as claimed in claim 1 where the modulation is Rectangular Quadrature Amplitude Modulation.

6. The method as claimed in claim 1, wherein the modulated carrier is modulated according to M-ary phase shift keying.

7. The method as claimed in claim 6, wherein M equals $2^k$, wherein k is a positive integer.

8. The method as claimed in claim 1, wherein the modulation is selected from the group consisting of Binary Phase Shift Keying, Quaternary Phase Shift Keying, 8-Phase Shift Keying, 16-Phase Shift Keying, Rectangular Quadrature Amplitude Modulation-4, Rectangular Quadrature Amplitude Modulation-16, Rectangular Quadrature Amplitude Modulation-64, Rectangular Quadrature Amplitude Modulation-256, Rectangular Offset-Quadrature Amplitude Modulation-16, Rectangular Offset-Quadrature Amplitude Modulation-64, Rectangular Offset-Quadrature Amplitude Modulation 256, Offset-Quaternary Phase Shift Keying, Offset-8 Phase Shift Keying, Offset-16 Phase Shift Keying, and Minimum Shift Keying.

9. The method as claimed in claim 1, wherein the received phase is expressed as being between $[-\pi,\pi)$ radians prior to generating the metric, and wherein the base function as implemented spans only $[-\pi,\pi)$ radians.

10. The method as claimed in claim 1, wherein the received phase is encoded using an encoding scheme that linearly encompasses substantially all of the possible received phases.

11. The method as claimed in claim 1, wherein the metric is generated as a function of a principal angle that is directly proportional to the received phase modulo $(\pi/2M)$.

12. The method as claimed in claim 11, wherein the principal angle is normalized such that its supremum equals the absolute value of the maxima of the triangle wave.

13. The method as claimed in claim 11, wherein the principal angle comprises one or more of the least significant bits of the received phase.

14. The method as claimed in claim 11, wherein generating the metric comprises:
   inverting the principal angle as a function of one or more bits of the received phase; and
   adding one of A, −A or 0 to the principal angle or its inverse as a function of two or more bits of the received phase, wherein A is the absolute value of the maxima of the triangle wave.

15. The method as claimed in claim 11, wherein an encoding scheme is one's complement, two's complement, or sign-magnitude encoding, the received phase has b bits, and M equals $2^k$, wherein k is a positive integer.

16. The method as claimed in claim 15, wherein the principal angle comprises a plurality of the most significant bits of bits [b-3-$\log_2$ M:0] of the received phase.

17. The method as claimed in claim 15, wherein the principal angle is proportional to a binary number that comprises a plurality of the most significant bits of bits [b-3-$\log_2$ M:0] of the received phase.

18. The method as claimed in claim 15, wherein generating the metric comprises:
   inverting the principal angle as a function of one or more of the bits [b-1-$\log_2$ M:b-2-$\log_2$ M] of the received phase; and
   adding either A, −A or 0 to the principal angle or its inverse as a function of bits [b-1-$\log_2$ M:b-2-$\log_2$ M] of the received phase, wherein A is the absolute value of the maxima of the triangle wave.

19. A method for generating a metric that is a function of a phase difference between a modulated carrier and a local carrier, the method comprising:
   obtaining a baseband symbol from the modulated carrier that is modulated using the symbol according to a modulation order (M) equaling the number of distinct ideal symbol phases used to modulate the modulated carrier, wherein ideal symbol phases are uniformly distributed within any continuous phase interval spanning $2\pi$ radians;
   determining the phase of the symbol; and
   generating the metric from the phase, wherein possible metrics depend on possible phases according to a base function that comprises a triangle wave having positively and negatively sloped linear segments whose slopes have identical absolute values and that is periodic with a period of $2\pi/M$ radians, wherein the ideal symbol phases correspond to identically valued metrics located on the triangle wave.

20. The method as claimed in claim 19, wherein the base function has a value of zero at each of the ideal symbol phases.

21. The method as claimed in claim 19, wherein the ideal symbol phases correspond to identical values for the metric located along either the positively sloped linear segments or the negatively sloped linear segments.

22. The method as claimed in claim 19, wherein a maxima and minima of the triangle wave have identical absolute values.

23. The method as claimed in claim 19, wherein the modulated carrier is modulated according to Quadrature Amplitude Modulation.

24. The method as claimed in claim 19, wherein the modulated carrier is modulated according to M-ary phase shift keying.

25. The method as claimed in claim 19, wherein the modulation is selected from the group consisting of Binary Phase Shift Keying, Quaternary Phase Shift Keying, 8-Phase Shift Keying, 16-Phase Shift Keying, Rectangular Quadrature Amplitude Modulation-4, Rectangular Quadrature Amplitude Modulation-16, Rectangular Quadrature Amplitude Modulation-64, Rectangular Quadrature Amplitude Modulation-256, Rectangular Offset-Quadrature Amplitude Modulation-16, Rectangular Offset-Quadrature Amplitude Modulation-64, Rectangular Offset-Quadrature Amplitude Modulation-256, Offset-Quaternary Phase Shift Keying, Offset-8 Phase Shift Keying, Offset-16 Phase Shift Keying, and Minimum Shift Keying.

26. The method as claimed in claim 19, wherein the received phase is expressed as being between $[-\pi,\pi)$ radians prior to generating the metric, and wherein the base function as implemented spans only $[-\pi,\pi)$ radians.

27. The method as claimed in claim 19, wherein the received phase is encoded using an encoding scheme that linearly encompasses substantially all of the possible received phases.

28. The method as claimed in claim 19, wherein the metric is generated as a function of a principal angle that is directly proportional to the received phase modulo ($\pi/2M$).

29. A phase detector for generating a metric that is a function of a phase difference between a modulated carrier and a local carrier, the phase detector comprising:
 a front end configured to obtain a baseband symbol from the modulated carrier that is modulated using the symbol according to a modulation whose constellation diagram has M-fold rotational symmetry, wherein M is a positive integer greater than or equal to 2;
 a phase determiner communicatively coupled to the front end and configured to determine a received phase of the baseband symbol; and
 a metric generator communicatively coupled to the phase determiner and configured to generate the metric from the received phase, wherein possible metrics depend on possible received phases according to a base function that comprises a triangle wave having positively and negatively sloped linear segments whose slopes have identical absolute values and that is periodic with a period of $2\pi/M$ radians.

30. The phase detector as claimed in claim 29, wherein a maxima and minima of the triangle wave have identical absolute values.

31. The phase detector as claimed in claim 29, wherein the modulated carrier is modulated according to Quadrature Amplitude Modulation.

32. The phase detector as claimed in claim 31, wherein the number of modulation symbols equals $2^k$, wherein k is a positive integer.

33. The phase detector as claimed in claim 29, wherein the modulation is Rectangular Quadrature Amplitude Modulation.

34. The phase detector as claimed in claim 29, wherein the modulated carrier is modulated according to M-ary phase shift keying.

35. The phase detector as claimed in claim 34, wherein M equals $2^k$, wherein k is a positive integer.

36. The phase detector as claimed in claim 29, wherein the modulation is selected from the group consisting of Binary Phase Shift Keying, Quaternary Phase Shift Keying, 8-Phase Shift Keying, 16-Phase Shift Keying, Rectangular Quadrature Amplitude Modulation-4, Rectangular Quadrature Amplitude Modulation-16, Rectangular Quadrature Amplitude Modulation-64, Rectangular Quadrature Amplitude Modulation-256, Rectangular Offset-Quadrature Amplitude Modulation-16, Rectangular Offset-Quadrature Amplitude Modulation-64, Rectangular Offset-Quadrature Amplitude Modulation-256, Offset-Quaternary Phase Shift Keying, Offset-8 Phase Shift Keying, Offset-16 Phase Shift Keying, and Minimum Shift Keying.

37. The phase detector as claimed in claim 29, wherein the phase determiner is configured to express the received phase as being between [$-\pi,\pi$) radians, and wherein the base function as implemented spans only [$-\pi,\pi$) radians.

38. The phase detector as claimed in claim 29, wherein the phase determiner is configured to encode the received phase using an encoding scheme that linearly encompasses substantially all of the possible received phases.

39. The phase detector as claimed in claim 29, wherein the metric generator is configured to determine for the received phase a principal angle that is directly proportional to the received phase modulo ($\pi/2M$) and to determine the metric as a function of the principal angle.

40. The phase detector as claimed in claim 39, wherein the metric generator is configured to normalize the principal angle such that its supremum equals the absolute value of the maxima of the triangle wave.

41. The phase detector as claimed in claim 39, wherein the phase determiner encodes the received phase such that the principal angle comprises one or more of the least significant bits of the phase.

42. The phase detector as claimed in claim 39, wherein the phase determiner encodes the received phase such that one or more bits (inversion control bits) of the received phase indicate whether to invert the principal angle and such that two or more bits (selection bits) of the received phase indicate whether to add A, −A or 0 to the principal angle or its inverse, wherein A is the absolute value of the maxima of the triangle wave, and wherein the metric generator comprises:
 inverting hardware comprising:
  a data input to which the principal angle is input;
  an inversion control input to which the inversion control bits are input; and
  a data output that outputs the inverse of the principal angle when the inversion control bits indicate the principal angle is to be inverted and otherwise outputs the principal angle;
 data selection hardware comprising:
  data inputs to which A, −A or 0 is input;
  a data selection input to which the selection bits are input; and
  a data output that outputs either A, −A or 0 in accordance with which one of the data inputs of the data selection hardware is selected by the selection bits; and
 adding hardware comprising:
  data inputs communicatively coupled to the data outputs of the inverting hardware and the data selection hardware; and
  a data output that outputs the sum of signals at the data inputs of the adding hardware.

43. The phase detector as claimed in claim 42 wherein:
 the inverting hardware comprises a first XOR gate configured to receive the inversion control bits and an array of XOR gates each having one input to receive one bit of the principal angle, wherein the output of the first XOR gate is communicatively coupled to another input of each of the XOR gates in the array;
 the data selection hardware comprises a multiplexer; and
 the adding hardware comprises an adder.

44. The phase detector as claimed in claim 42, wherein A is 1.

45. The phase detector as claimed in claim 39, wherein the phase determiner encodes the received phase such that a principal angle precursor comprises one or more of the least significant bits of the received phase, and wherein the principal angle is directly proportional to the principal angle precursor.

46. The phase detector as claimed in claim 45, wherein the phase determiner encodes the received phase such that one or more bits (inversion control bits) of the received phase indicate whether to invert the principal angle precursor and such that two or more bits (selection bits) of the received phase indicate whether to add A, −A or 0 to the principal angle or its inverse, wherein A is the absolute value of the maxima of the triangle wave, and wherein the metric generator comprises:
 inverting hardware comprising:
  a data input to which the principal angle precursor is input;

an inversion control input to which the inversion control bits are input; and a data output that outputs the inverse of the principal angle precursor when the inversion control bits indicate the principal angle precursor is to be inverted and otherwise outputs the principal angle precursor;

data selection hardware comprising:

a data input to which A, −A and 0 are input;

a data selection input to which the selection bits are input; and a data output that outputs either A, −A or 0 in accordance with which one of the data inputs of the data selection hardware is selected by the selection bits;

amplification hardware comprising:

a data input communicatively coupled to the data output of the inverting hardware; and a data output that outputs the amplification of the signal at the data input; and adding hardware comprising:

data inputs communicatively coupled to the data outputs of the amplification hardware and the data selection hardware; and a data output that outputs the sum of signals at the data inputs of the adding hardware.

47. The phase detector as claimed in claim 39, wherein the phase determiner encodes the received phase in one's complement, two's complement, or sign-magnitude encoding, wherein the received phase has b bits and M equals $2^k$ wherein k is a positive integer, and wherein the principal angle comprises a plurality of the most significant bits of bits [b-3-$\log_2$ M:0] of the received phase.

48. The phase detector as claimed in claim 39, wherein the phase determiner encodes the received phase such that one or more of bits [b-1-$\log_2$ M:b-2-$\log_2$ M] (inversion control bits) of the received phase indicate whether to invert the principal angle and such that bits [b-$\log_2$ M-1:b-$\log_2$ M-2] (selection bits) of the received phase indicate whether to add A, −A or 0 to the principal angle or its inverse, wherein A is the absolute value of the maxima of the triangle wave, and wherein the metric generator comprises:

inverting hardware comprising:

a data input to which the principal angle is input;

an inversion control input to which the inversion control bits are input;

a data output that outputs the inverse of the principal angle when the inversion control bits indicate the principal angle is to be inverted and otherwise outputs the principal angle;

data selection hardware comprising:

data inputs to which A, −A or 0 are input;

a data selection input to which the selection bits are input; and a data output that outputs either A, −A or 0 in accordance with which one of the data inputs of the data selection hardware is selected by the selection bits; and adding hardware comprising:

data inputs communicatively coupled to the data outputs of the inverting hardware and the data selection hardware; and a data output that outputs the sum of the data outputs of the inverting hardware and the data selection hardware.

49. The phase detector as claimed in claim 48, wherein:
the inverting hardware comprises a first XOR gate configured to receive the inversion control bits and an array of XOR gates each having one input to receive one bit of the principal angle, wherein the output of the first XOR gate is communicatively coupled to another input of each of the XOR gates in the array;

the data selection hardware comprises a multiplexer; and the adding hardware comprises an adder.

50. The phase detector as claimed in claim 48, wherein A is 1.

51. The phase detector as claimed in claim 39, wherein the phase determiner encodes the received phase in one's complement, two's complement, or sign-magnitude encoding, wherein the received phase has b bits and M equals $2^k$ wherein k is a positive integer, and wherein the principal angle is proportional to a principal angle precursor that comprises a plurality of the most significant bits of bits [b-3-$\log_2$ M:0] of the received phase.

52. The phase detector as claimed in claim 51, wherein the phase determiner encodes the received phase such that one or more of the bits [b-1-$\log_2$ M:b-2-$\log_2$ M] (inversion control bits) of the received phase indicates whether to invert the principal angle precursor and such that bits [b-$\log_2$ M-1:b-$\log_2$ M-2] (selection bits) of the received phase indicate whether to add A, −A or 0 to the principal angle or its inverse, wherein A is the absolute value of the maxima of the triangle wave, and wherein the metric generator comprises:

inverting hardware comprising:

a data input to which the principal angle precursor is input;

an inversion control input to which the inversion control bits are input; and a data output that outputs the inverse of the principal angle precursor when the inversion control bits indicate the principal angle precursor is to be inverted and otherwise outputs the principal angle precursor;

data selection hardware comprising:

a data input to which A, −A and 0 are input;

a data selection input to which the selection bits are input; and a data output that outputs either A, −A or 0 in accordance with which one of the data inputs of the data selection hardware is selected by the selection bits;

amplification hardware comprising:

a data input communicatively coupled to the data output of the inverting hardware; and a data output that outputs the amplification of the signal at the data input; and adding hardware comprising:

data inputs communicatively coupled to the data outputs of the amplification hardware and the data selection hardware; and a data output that outputs the sum of signals at the data inputs of the adding hardware.

53. The phase detector as claimed in claim 52, wherein:
the inverting hardware comprises a first XOR gate configured to receive the inversion control bits and an array of XOR gates each having one input to receive one bit of the principal angle precursor, wherein the output of the first XOR gate is communicatively coupled to another input of each of the XOR gates in the array;

the data selection hardware comprises a multiplexer;

the amplification hardware comprises a bit shifter; and the adding hardware comprises an adder.

54. A phase detector for generating a metric that is a function of a phase difference between a modulated carrier and a local carrier, the phase detector comprising:

a front end configured to obtain a baseband symbol from the modulated carrier that is modulated using the symbol according to a modulation order (M) equaling the number of distinct ideal symbol phases used to modulate the modulated carrier, wherein ideal symbol phases are uniformly distributed within any continuous phase interval spanning 2π radians;

a phase determiner communicatively coupled to the front end and configured to determine the phase of the baseband symbols; and a metric generator communicatively coupled to the phase determiner and configured to determine the metric from the phase, wherein possible metrics depend on possible phases according to a base function that comprises a triangle wave having positively and negatively sloped linear segments whose slopes have identical absolute values and that is periodic with a period of 2π/M radians, wherein the ideal symbol phases correspond to identically valued metrics located on the triangle wave.

55. The phase detector as claimed in claim 54, wherein the base function has a value of zero at each of the ideal symbol phases.

56. The phase detector as claimed in claim 54, wherein the ideal symbol phases correspond to identical values for the metric located along either the positively sloped linear segments or the negatively sloped linear segments.

57. The phase detector as claimed in claim 54, wherein a maxima and minima of the triangle wave have identical absolute values.

58. The phase detector as claimed in claim 54, wherein the modulated carrier is modulated according to Quadrature Amplitude Modulation.

59. The phase detector as claimed in claim 54, wherein the modulated carrier is modulated according to M-ary phase shift keying.

60. The phase detector as claimed in claim 54, wherein the modulation is selected from the group consisting of Binary Phase Shift Keying, Quaternary Phase Shift Keying, 8-Phase Shift Keying, 16-Phase Shift Keying, Rectangular Quadrature Amplitude Modulation-4, Rectangular Quadrature Amplitude Modulation-16, Rectangular Quadrature Amplitude Modulation-64, Rectangular Quadrature Amplitude Modulation-256, Rectangular Offset-Quadrature Amplitude Modulation-16, Rectangular Offset-Quadrature Amplitude Modulation-64, Rectangular Offset-Quadrature Amplitude Modulation-256, Offset-Quaternary Phase Shift Keying, Offset-8 Phase Shift Keying, Offset-16 Phase Shift Keying, and Minimum Shift Keying.

61. The phase detector as claimed in claim 54, wherein the phase determiner is configured to express the received phase as being between [−π,π) radians, and wherein the base function as implemented spans only [−π,π) radians.

62. The phase detector as claimed in claim 54, wherein the phase determiner is configured to encode the received phase using an encoding scheme that linearly encompasses substantially all of the possible received phases.

63. The phase detector as claimed in claim 54, wherein the metric generator is configured to determine for the received phase a principal angle that is directly proportional to the received phase modulo (π/2M) and to determine the metric as a function of the principal angle.

64. A phase detector for generating a metric that is a function of a phase difference between a modulated carrier and a local carrier, the phase detector comprising:

selecting means for selecting one of A, −A or 0 in response to selection bits;

inverting means for inverting a principal angle in response to inversion control bits; and adding means, communicatively coupled to outputs of the selecting means and the inverting means, for adding one of A, −A or 0 to the principal angle or its inverse to generate the metric, wherein the modulated carrier is modulated using a symbol according to a modulation order (M) equaling the number of distinct ideal symbol phases used to modulate the modulated carrier, wherein ideal symbol phases are uniformly distributed within any continuous phase interval spanning 2π radians, and wherein the principal angle is modulo (π/2M) of the phase of the symbol normalized to have a supremum of A, wherein possible metrics depend on possible phases of the symbol according to a base function that comprises a triangle wave having positively and negatively sloped linear segments whose slopes have identical absolute values and that is periodic with a period of 2π/M radians, and wherein A is the absolute value of the maximum of the base function.

65. The phase detector as claimed in claim 64, wherein the modulation is selected from the group consisting of Binary Phase Shift Keying, Quaternary Phase Shift Keying, 8-Phase Shift Keying, 16-Phase Shift Keying, Rectangular Quadrature Amplitude Modulation-4, Rectangular Quadrature Amplitude Modulation-16, Rectangular Quadrature Amplitude Modulation-64, Rectangular Quadrature Amplitude Modulation-256, Rectangular Offset-Quadrature Amplitude Modulation-16, Rectangular Offset-Quadrature Amplitude Modulation-64, Rectangular Offset-Quadrature Amplitude Modulation-256, Offset-Quaternary Phase Shift Keying, Offset-8 Phase Shift Keying, Offset-16 Phase Shift Keying, and Minimum Shift Keying.

66. An apparatus for evaluating a base function, the apparatus comprising:

a front end configured to obtain a baseband symbol from a modulated carrier that is modulated using the symbol according to a modulation;

a phase determiner communicatively coupled to the front end and configured to determine a received phase of the baseband symbol; and a metric generator communicatively coupled to the phase determiner and configured to generate the metric from the received phase, wherein possible metrics depend on possible received phases according to a base function that comprises a triangle wave having positively and negatively sloped linear segments whose slopes have identical absolute values and that is periodic with a period of 2π/N radians, wherein N is a positive integer greater than 1.

67. A phase detector for generating a metric that is a function of a phase difference between a modulated carrier and a local carrier, the phase detector comprising:

selecting means for selecting one of A, −A or 0 in response to selection bits;

inverting means for inverting a principal angle in response to inversion control bits; and adding means, communicatively coupled to outputs of the selecting means and the inverting means, for adding one of A, −A or 0 to the principal angle or its inverse to generate the metric, wherein the modulated carrier is modulated using a symbol according to a modulation whose constellation diagram has M-fold rotational symmetry, wherein M is a positive integer greater than or equal to 2, and wherein the principal angle is modulo (π/2M) of the phase of the symbol, normalized to have a supremum of A, wherein possible metrics depend on possible phases of the symbol according to a base function that comprises a triangle wave having positively and negatively sloped linear segments whose slopes have identical absolute values and that is periodic with a period of 2π/M radians, and wherein A is the absolute value of the maximum of the base function.

* * * * *